(12) United States Patent
Khlat et al.

(10) Patent No.: US 9,893,709 B2
(45) Date of Patent: Feb. 13, 2018

(54) RF TRIPLEXER ARCHITECTURE

(71) Applicant: RF Micro Devices, Inc., Greensboro, NC (US)

(72) Inventors: Nadim Khlat, Cugnaux (FR); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 153 days.

(21) Appl. No.: 14/673,192

(22) Filed: Mar. 30, 2015

(65) Prior Publication Data

US 2015/0263405 A1    Sep. 17, 2015

Related U.S. Application Data

(63) Continuation-in-part of application No. 14/659,314, filed on Mar. 16, 2015, now Pat. No. 9,729,191.

(60) Provisional application No. 61/953,233, filed on Mar. 14, 2014, provisional application No. 61/972,161, filed on Mar. 28, 2014.

(51) Int. Cl.
*H03H 7/46* (2006.01)
*H03H 9/70* (2006.01)
*H03H 7/01* (2006.01)
*H01P 5/22* (2006.01)
*H03H 9/72* (2006.01)
(Continued)

(52) U.S. Cl.
CPC ............... *H03H 7/46* (2013.01); *H01P 5/22* (2013.01); *H01P 5/227* (2013.01); *H03H 7/0138* (2013.01); *H03H 7/463* (2013.01); *H03H 9/706* (2013.01); *H03H 9/725* (2013.01); *H04B 1/525* (2013.01); *H04B 1/58* (2013.01)

(58) Field of Classification Search
CPC .. H01P 5/22; H01P 5/227; H03H 7/46; H03H 9/706; H03H 9/725; H03H 7/463; H03H 7/0138
USPC .......................... 333/117, 118, 120, 132, 133
See application file for complete search history.

(56) References Cited

U.S. PATENT DOCUMENTS 3,656,162 A   4/1972  Mee
3,946,328 A   3/1976  Boctor
(Continued)

OTHER PUBLICATIONS

"Understanding Solutions for the Crowded Electromagnetic Frequency Spectrum", Nov. 23, 2016, http://electronicdesign.com/communications/understanding-solutions-crowded-electromagnetic-frequency-spectrum, pp. 1-6.*

(Continued)

*Primary Examiner* — Rakesh Patel
(74) *Attorney, Agent, or Firm* — Withrow & Terranova, P.L.L.C.

(57) ABSTRACT

RF circuitry, which includes a first hybrid RF coupler, a second hybrid RF coupler, a third hybrid RF coupler, and RF filter circuitry, is disclosed. The first hybrid RF coupler provides a first main port, a first pair of quadrature ports, and an isolation port. The second hybrid RF coupler provides a second main port and a second pair of quadrature ports. The third hybrid RF coupler provides a third main port and a third pair of quadrature ports. RF filter circuitry is coupled to the first pair of quadrature ports, the second pair of quadrature ports, and the third pair of quadrature ports. The first main port, the second main port, and the third main port provide main ports of the RF triplexer. The isolation port is a common port of the RF triplexer for coupling to an RF antenna.

22 Claims, 20 Drawing Sheets

(51) Int. Cl.
*H04B 1/525* (2015.01)
*H04B 1/58* (2006.01)

(56) References Cited

U.S. PATENT DOCUMENTS

| | | | |
|---|---|---|---|
| 4,902,992 A * | 2/1990 | Rubin | H01P 1/2135 333/126 |
| 5,774,193 A | 6/1998 | Vaughan | |
| 6,586,786 B2 | 7/2003 | Kitazawa et al. | |
| 6,710,813 B1 * | 3/2004 | Grandchamp | H01P 1/2138 333/126 |
| 6,980,067 B2 * | 12/2005 | Forrester | H04B 1/005 333/126 |
| 7,035,602 B2 | 4/2006 | Satoh et al. | |
| 7,376,440 B2 | 5/2008 | Forrester et al. | |
| 7,546,091 B2 | 6/2009 | Murakami et al. | |
| 8,149,742 B1 | 4/2012 | Sorsby | |
| 8,385,871 B2 | 2/2013 | Wyville | |
| 8,552,816 B2 | 10/2013 | Khlat | |
| 8,634,029 B2 | 1/2014 | Pugel | |
| 8,849,217 B2 | 9/2014 | Rousu et al. | |
| 8,892,057 B2 | 11/2014 | Khlat | |
| 8,903,409 B2 | 12/2014 | Winiecki et al. | |
| 9,118,376 B2 | 8/2015 | Khlat et al. | |
| 9,124,355 B2 | 9/2015 | Black et al. | |
| 2002/0053954 A1 | 5/2002 | Shamsaifar et al. | |
| 2002/0130734 A1 | 9/2002 | Liang et al. | |
| 2002/0137471 A1 | 9/2002 | Satoh et al. | |
| 2004/0189526 A1 | 9/2004 | Frank | |
| 2005/0020297 A1 | 1/2005 | Axness et al. | |
| 2005/0195047 A1 | 9/2005 | Park et al. | |
| 2005/0239421 A1 | 10/2005 | Kim et al. | |
| 2006/0194550 A1 | 8/2006 | Block et al. | |
| 2007/0022460 A1 | 1/2007 | Kim et al. | |
| 2008/0240000 A1 | 10/2008 | Kidd | |
| 2009/0174622 A1 | 7/2009 | Kanou | |
| 2010/0102899 A1 | 4/2010 | Engel | |
| 2010/0189031 A1 | 7/2010 | Kanou | |
| 2011/0110452 A1 | 5/2011 | Fukamachi et al. | |
| 2013/0077540 A1 | 3/2013 | Black et al. | |
| 2013/0176913 A1 | 7/2013 | Niskanen et al. | |
| 2013/0187825 A1 | 7/2013 | Andujar Linares et al. | |
| 2013/0201880 A1 | 8/2013 | Bauder et al. | |
| 2013/0235806 A1 | 9/2013 | Nilsson et al. | |
| 2013/0244591 A1 | 9/2013 | Weissman et al. | |
| 2013/0244722 A1 | 9/2013 | Rousu et al. | |
| 2014/0003300 A1 | 1/2014 | Weissman et al. | |
| 2014/0185498 A1 | 7/2014 | Schwent et al. | |
| 2014/0192845 A1 | 7/2014 | Szini et al. | |
| 2014/0269853 A1 | 9/2014 | Gudem et al. | |
| 2014/0321353 A1 | 10/2014 | Lhan | |
| 2015/0017993 A1 | 1/2015 | Ishii | |
| 2016/0126987 A1 | 5/2016 | Wloczysiak | |
| 2016/0127029 A1 | 5/2016 | Wloczysiak | |
| 2017/0310381 A1 | 10/2017 | Lim et al. | |

OTHER PUBLICATIONS

Non-Final Office Action for U.S. Appl. No. 14/498,991, dated Aug. 17, 2015, 13 pages.
Notice of Allowance for U.S. Appl. No. 14/282,393, dated Aug. 19, 2015, 8 pages.
Non-Final Office Action for U.S. Appl. No. 14/498,746, dated Feb. 24, 2016, 11 pages.
Final Office Action for U.S. Appl. No. 14/498,991, dated Feb. 3, 2016, 14 pages.
Non-Final Office Action for U.S. Appl. No. 14/497,919, dated Mar. 10, 2016, 21 pages.
U.S. Appl. No. 14/267,095, filed May 1, 2014.
U.S. Appl. No. 14/282,393, filed May 20, 2014.
U.S. Appl. No. 14/302,500, filed Jun. 12, 2014.
U.S. Appl. No. 14/498,746, filed Sep. 26, 2014.
U.S. Appl. No. 14/659,314, filed Mar. 16, 2015.
U.S. Appl. No. 14/498,991, filed Sep. 26, 2014.
U.S. Appl. No. 14/497,919, filed Sep. 26, 2014.
Non-Final Office Action for U.S. Appl. No. 14/267,095, dated Jun. 16, 2016, 8 pages.
Non-Final Office Action for U.S. Appl. No. 14/498,991, dated May 2, 2016, 14 pages.
Final Office Action for U.S. Appl. No. 14/498,746, dated Aug. 5, 2016, 12 pages.
Non-Final Office Action for U.S. Appl. No. 14/659,314, dated Sep. 19, 2016, 15 pages.
Final Office Action for U.S. Appl. No. 14/497,919, dated Sep. 22, 2016, 26 pages.
Notice of Allowance for U.S. Appl. No. 14/302,500, dated Oct. 23, 2015, 8 pages.
Non-Final Office Action for U.S. Appl. No. 14/498,991, dated Mar. 9, 2017, 14 pages.
Advisory Action for U.S. Appl. No. 14/497,919, dated Feb. 21, 2017, 3 pages.
Non-Final Office Action for U.S. Appl. No. 14/267,095, dated Dec. 27, 2016, 10 pages.
Advisory Action for U.S. Appl. No. 14/498,991, dated Jan. 3, 2017, 3 pages.
Final Office Action for U.S. Appl. No. 14/498,991, dated Sep. 30, 2016, 15 pages.
Notice of Allowance for U.S. Appl. No. 14/498,746, dated Nov. 15, 2016, 8 pages.
Notice of Allowance for U.S. Appl. No. 14/267,095, dated Mar. 29, 2017, 7 pages.
Notice of Allowance for U.S. Appl. No. 14/659,314, dated Apr. 3, 2017, 8 pages.
Non-Final Office Action for U.S. Appl. No. 14/497,919, dated May 12, 2017, 26 pages.
Notice of Allowance for U.S. Appl. No. 14/498,991, dated Aug. 23, 2017, 9 pages.
Notice of Allowance and Examiner-Initiated Interview Summary for U.S. Appl. No. 14/497,919, dated Nov. 6, 2017, 19 pages.

* cited by examiner

RF TRIPLEXER ARCHITECTURE

RELATED APPLICATIONS

The present application claims the benefit of U.S. provisional patent application No. 61/972,161, filed Mar. 28, 2014.

The present application claims the benefit of and is a continuation in part of U.S. patent application Ser. No. 14/659,314, entitled "TRIPLEXER ARCHITECTURE FOR AGGREGATION," filed Mar. 16, 2015, now U.S. Pat. No. 9,729,191, which claims the benefit of U.S. provisional patent applications No. 61/953,233, filed Mar. 14, 2014, and No. 61/972,161, filed Mar. 28, 2014.

All of the applications listed above are hereby incorporated herein by reference in their entireties.

FIELD OF THE DISCLOSURE

Embodiments of the present disclosure relate to radio frequency (RF) communications systems, which may include RF front-end circuitry, RF transceiver circuitry, RF transmit circuitry, RF receive circuitry, RF diplexers, RF duplexers, RF triplexers, RF filters, RF antennas, RF switches, RF combiners, RF splitters, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

RF circuitry, which includes a first hybrid RF coupler, a second hybrid RF coupler, a third hybrid RF coupler, and RF filter circuitry, is disclosed according to one embodiment of the present disclosure. The first hybrid RF coupler provides a first main port, a first pair of quadrature ports, and an isolation port. The second hybrid RF coupler provides a second main port and a second pair of quadrature ports. The third hybrid RF coupler provides a third main port and a third pair of quadrature ports. RF filter circuitry is coupled to the first pair of quadrature ports, the second pair of quadrature ports, and the third pair of quadrature ports. The first main port, the second main port, and the third main port provide main ports of the RF triplexer. The isolation port is a common port of the RF triplexer for coupling to an RF antenna.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

RF circuitry, which includes a first hybrid RF coupler, a second hybrid RF coupler, a third hybrid RF coupler, and RF filter circuitry, is disclosed according to one embodiment of the present disclosure. The first hybrid RF coupler provides a first main port, a first pair of quadrature ports, and an isolation port. The second hybrid RF coupler provides a second main port and a second pair of quadrature ports. The third hybrid RF coupler provides a third main port and a third pair of quadrature ports. RF filter circuitry is coupled to the first pair of quadrature ports, the second pair of quadrature ports, and the third pair of quadrature ports. The first main port, the second main port, and the third main port provide main ports of the RF triplexer. The isolation port is a common port of the RF triplexer for coupling to an RF antenna.

RF circuitry, which includes a first hybrid RF coupler, a second hybrid RF coupler, and a third hybrid RF coupler, is disclosed according to an alternate embodiment of the present disclosure. The first hybrid RF coupler is coupled to a first RF antenna. The second hybrid RF coupler is configured to receive a first lowband RF receive signal via the first RF antenna. The first hybrid RF coupler is configured to receive one of a first midband RF receive signal and a first highband RF receive signal via the first RF antenna. The third hybrid RF coupler configured to receive another of the first midband RF receive signal and the first highband RF receive signal via the first RF antenna.

Figure 1:
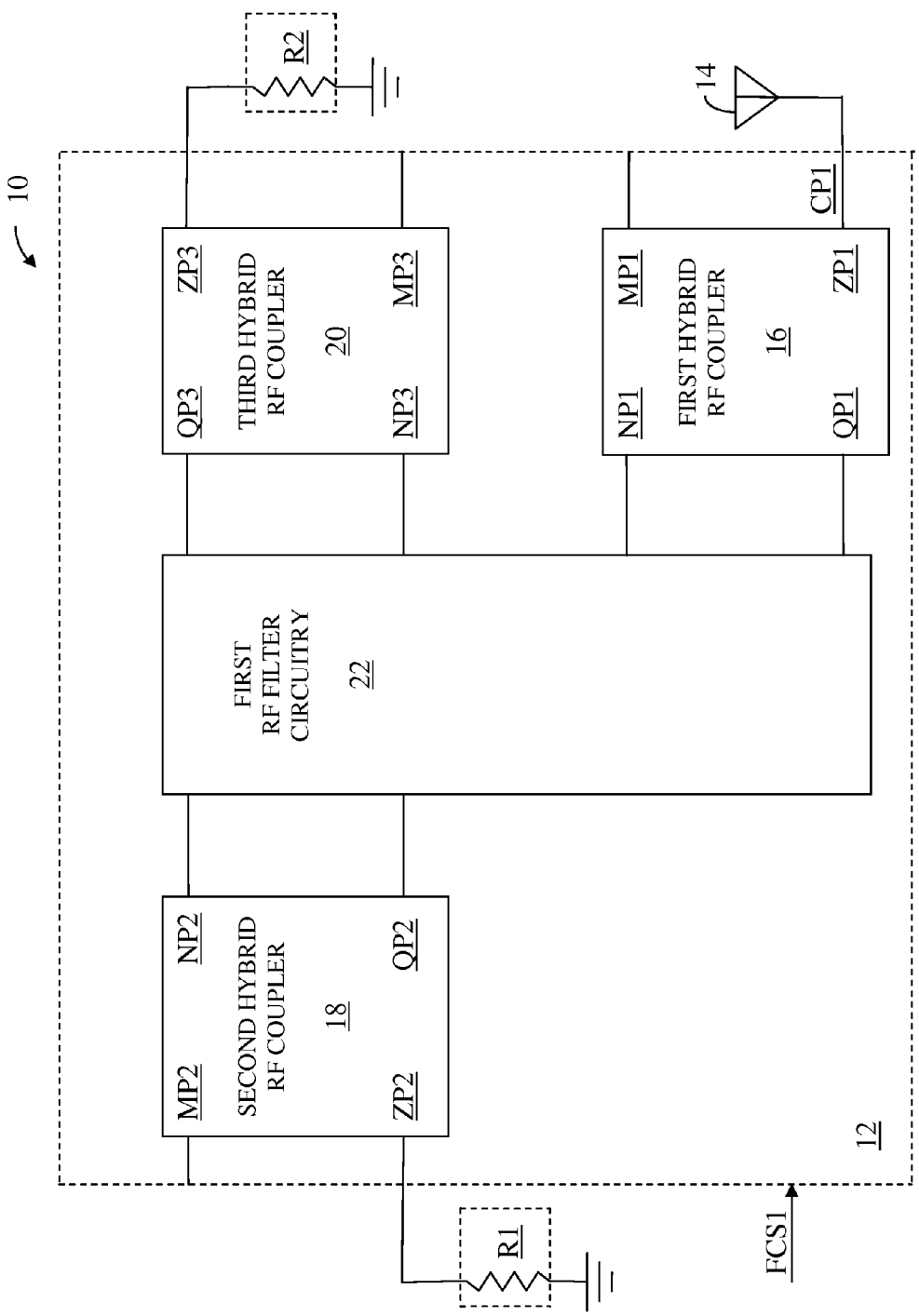
FIG. 1 shows RF communications circuitry according to one embodiment of the RF communications circuitry.

FIG. 1 shows RF communications circuitry 10 according to one embodiment of the RF communications circuitry 10. The RF communications circuitry 10 includes a first RF triplexer 12, a first RF antenna 14, a first isolation port resistive element R1, and a second isolation port resistive element R2. The first RF triplexer 12 includes a first hybrid RF coupler 16, a second hybrid RF coupler 18, a third hybrid RF coupler 20, first RF filter circuitry 22, and a first common port CP1.

In one embodiment of the first RF triplexer 12, the first RF triplexer 12 receives a first function configuration signal FCS1, such that the first RF filter circuitry 22 is first tunable RF filter circuitry. In this regard, filtering characteristics of the first RF filter circuitry 22 are based on the first function configuration signal FCS1. In an alternate embodiment of the RF communications circuitry 10, the first function configuration signal FCS1 is omitted, such that the first RF filter circuitry 22 is not tunable RF filter circuitry.

In general, the first RF filter circuitry 22 is coupled between the first hybrid RF coupler 16, the second hybrid RF coupler 18, and the third hybrid RF coupler 20. The first RF antenna 14 is coupled to the first hybrid RF coupler 16.

The first hybrid RF coupler 16 has a first main port MP1, a first pair of quadrature ports, which includes a first in-phase port NP1 and a first quadrature-phase port QP1, and a first isolation port ZP1, which functions as the first common port CP1. In this regard, the first isolation port ZP1 is coupled to the first RF antenna 14. The second hybrid RF coupler 18 has a second main port MP2, a second pair of quadrature ports, which includes a second in-phase port NP2 and a second quadrature-phase port QP2, and a second isolation port ZP2. The third hybrid RF coupler 20 has a third main port MP3, a third pair of quadrature ports, which includes a third in-phase port NP3 and a third quadrature-phase port QP3, and a third isolation port ZP3. As such, the first RF filter circuitry 22 is coupled to the first in-phase port NP1, the first quadrature-phase port QP1, the second in-phase port NP2, the second quadrature-phase port QP2, the third in-phase port NP3, and the third quadrature-phase port QP3.

The first isolation port resistive element R1 is coupled between the second isolation port ZP2 and ground. In one embodiment of the first isolation port resistive element R1, the first isolation port resistive element R1 is adjusted to compensate for an impedance mismatch between the first RF antenna 14 and the first isolation port ZP1. In an alternate embodiment of the RF communications circuitry 10, the first isolation port resistive element R1 is omitted.

The second isolation port resistive element R2 is coupled between the third isolation port ZP3 and ground. In one embodiment of the second isolation port resistive element R2, the second isolation port resistive element R2 is adjusted to compensate for an impedance mismatch between the first RF antenna 14 and the first isolation port ZP1. In an alternate embodiment of the RF communications circuitry 10, the second isolation port resistive element R2 is omitted.

Figure 2:
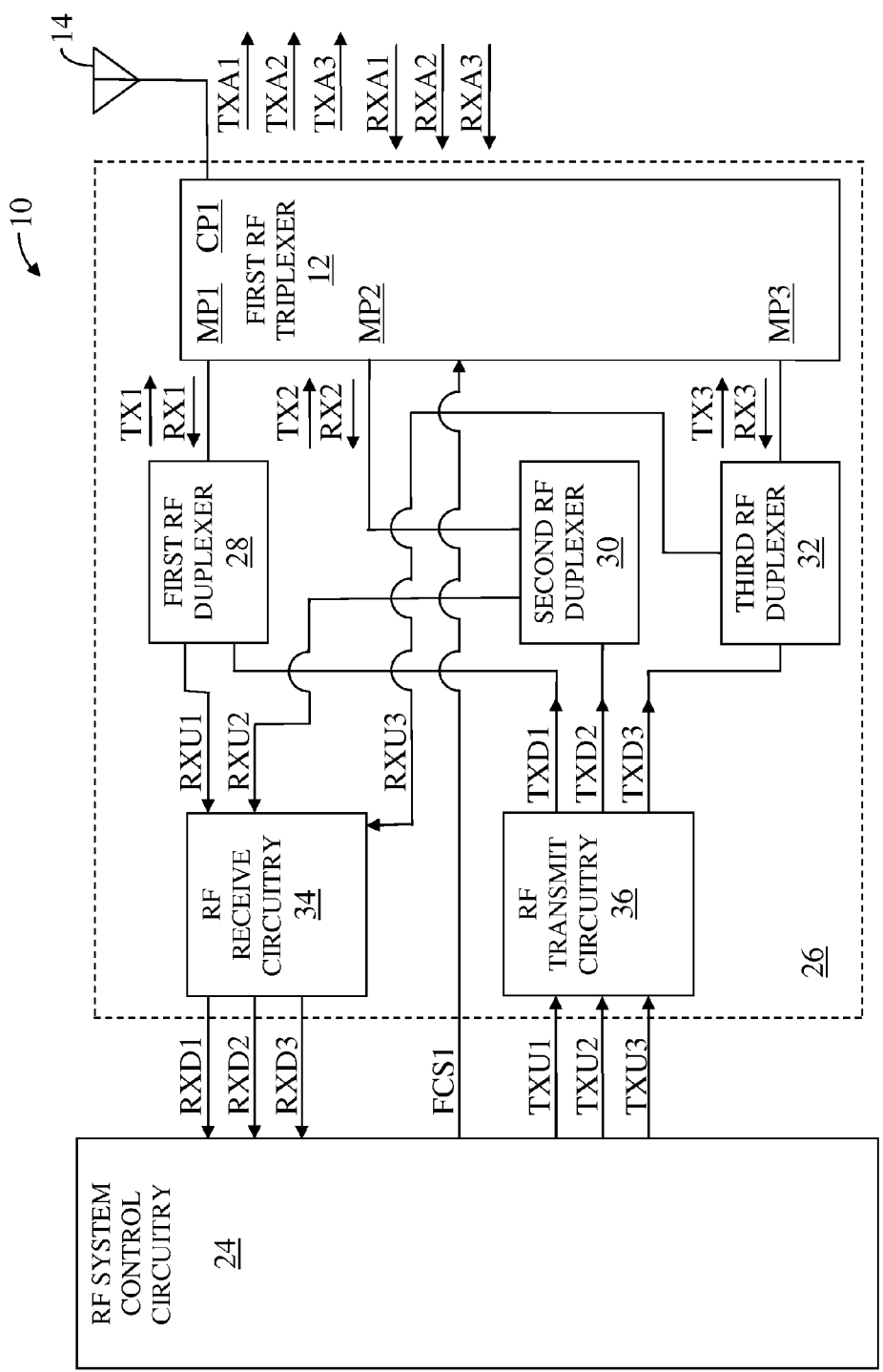
FIG. 2 shows the RF communications circuitry according to an alternate embodiment of the RF communications circuitry.

FIG. 2 shows RF communications circuitry 10 according to an alternate embodiment of the RF communications circuitry 10. The RF communications circuitry 10 illustrated in FIG. 2 is similar to the RF communications circuitry 10 illustrated in FIG. 1, except the RF communications circuitry 10 illustrated in FIG. 2 further includes RF system control circuitry 24 and RF front-end circuitry 26, which includes the first RF triplexer 12, a first RF duplexer 28, a second RF duplexer 30, a third RF duplexer 32, RF receive circuitry 34, and RF transmit circuitry 36. The first isolation port resistive element R1 and the second isolation port resistive element R2 are not shown to simplify FIG. 2.

The first RF triplexer 12 has the first common port CP1, the first main port MP1, the second main port MP2, and the third main port MP3. The first common port CP1 is coupled to the first RF antenna 14. The first main port MP1 is coupled to the first RF duplexer 28. The second main port MP2 is coupled to the second RF duplexer 30. The third main port MP3 is coupled to the third RF duplexer 32.

In one embodiment of the RF communications circuitry 10, the RF communications circuitry 10 transmits, receives, or both, RF signals to, from, or both, a highband RF communications band, a midband RF communications band, a lowband RF communications band, or any combination thereof. As such, the RF communications circuitry 10 may communicate simultaneously with the lowband RF communications band, the midband RF communications band, and the highband RF communications band.

In one embodiment of the RF communications circuitry 10, the lowband RF communications band, the midband RF communications band, and the highband RF communications band are defined as follows. A lowest frequency of the highband RF communications band is greater than all frequencies in the lowband RF communications band and the midband RF communications band. A highest frequency of the lowband RF communications band is less than all frequencies in the highband RF communications band and the midband RF communications band.

In one embodiment of the RF system control circuitry 24, the RF system control circuitry 24 provides a first upstream RF transmit signal TXU1 to the RF transmit circuitry 36, which processes the first upstream RF transmit signal TXU1 to provide a first downstream RF transmit signal TXD1. In a first embodiment of the first downstream RF transmit signal TXD1, the first downstream RF transmit signal TXD1 is a midband RF signal. In a second embodiment of the first downstream RF transmit signal TXD1, the first downstream RF transmit signal TXD1 is a highband RF signal.

In one embodiment of the RF system control circuitry 24, the RF system control circuitry 24 provides a second upstream RF transmit signal TXU2 to the RF transmit circuitry 36, which processes the second upstream RF transmit signal TXU2 to provide a second downstream RF transmit signal TXD2. In one embodiment of the second downstream RF transmit signal TXD2, the second downstream RF transmit signal TXD2 is a lowband RF signal.

In one embodiment of the RF system control circuitry 24, the RF system control circuitry 24 provides a third upstream RF transmit signal TXU3 to the RF transmit circuitry 36, which processes the third upstream RF transmit signal TXU3 to provide a third downstream RF transmit signal TXD3. In a first embodiment of the third downstream RF transmit signal TXD3, the third downstream RF transmit signal TXD3 is a highband RF signal. In a second embodiment of the third downstream RF transmit signal TXD3, the third downstream RF transmit signal TXD3 is a midband RF signal.

In an additional embodiment of the RF system control circuitry 24, the RF system control circuitry 24 simultaneously provides any or all of the first upstream RF transmit signal TXU1, the second upstream RF transmit signal TXU2, and the third upstream RF transmit signal TXU3 to the RF transmit circuitry 36, which processes any or all of the first upstream RF transmit signal TXU1, the second upstream RF transmit signal TXU2, and the third upstream RF transmit signal TXU3, respectively, to provide any or all of the first downstream RF transmit signal TXD1, the second downstream RF transmit signal TXD2, and the third downstream RF transmit signal TXD3, respectively.

In one embodiment of the first downstream RF transmit signal TXD1, the second downstream RF transmit signal TXD2, and the third downstream RF transmit signal TXD3, the first downstream RF transmit signal TXD1 is a highband RF signal, the second downstream RF transmit signal TXD2 is a lowband RF signal, and the third downstream RF transmit signal TXD3 is a midband RF signal.

In an alternate embodiment of the first downstream RF transmit signal TXD1, the second downstream RF transmit signal TXD2, and the third downstream RF transmit signal TXD3, the first downstream RF transmit signal TXD1 is a midband RF signal, the second downstream RF transmit signal TXD2 is a lowband RF signal, and the third downstream RF transmit signal TXD3 is a highband RF signal.

In one embodiment of the RF communications circuitry 10, the RF communications circuitry 10 provides transmit uplink carrier aggregation (TXULCA) by simultaneously providing at least two of the first upstream RF transmit signal TXU1, the second upstream RF transmit signal TXU2, and the third upstream RF transmit signal TXU3 to the RF transmit circuitry 36. The RF transmit circuitry 36 may include up-conversion circuitry, amplification circuitry, power supply circuitry, filtering circuitry, switching circuitry, combining circuitry, splitting circuitry, dividing circuitry, clocking circuitry, the like, or any combination thereof to process the first upstream RF transmit signal TXU1, the second upstream RF transmit signal TXU2, and the third upstream RF transmit signal TXU3.

In one embodiment of the RF receive circuitry 34, the RF receive circuitry 34 receives and processes a first upstream RF receive signal RXU1 to provide a first downstream RF receive signal RXD1 to the RF system control circuitry 24. In a first embodiment of the first upstream RF receive signal RXU1, the first upstream RF receive signal RXU1 is a midband RF signal. In a second embodiment of the first upstream RF receive signal RXU1, the first upstream RF receive signal RXU1 is a highband RF signal.

In an alternate embodiment of the RF receive circuitry 34, the RF receive circuitry 34 receives and processes a second upstream RF receive signal RXU2 to provide a second downstream RF receive signal RXD2 to the RF system control circuitry 24. In one embodiment of the second upstream RF receive signal RXU2, the second upstream RF receive signal RXU2 is a lowband RF signal.

In one embodiment of the RF receive circuitry 34, the RF receive circuitry 34 receives and processes a third upstream RF receive signal RXU3 to provide a third downstream RF receive signal RXD3 to the RF system control circuitry 24. In a first embodiment of the third upstream RF receive signal RXU3, the third upstream RF receive signal RXU3 is a highband RF signal. In a second embodiment of the first upstream RF receive signal RXU1, the first upstream RF receive signal RXU1 is a midband RF signal.

In an additional embodiment of the RF receive circuitry 34, the RF receive circuitry 34 simultaneously receives and processes at least two of the first upstream RF receive signal RXU1, the second upstream RF receive signal RXU2, and the third upstream RF receive signal RXU3, respectively, to provide at least two of the first downstream RF receive signal RXD1, the second downstream RF receive signal RXD2, and the third downstream RF receive signal RXD3, respectively.

In a first embodiment of the first upstream RF receive signal RXU1, the second upstream RF receive signal RXU2, and the third upstream RF receive signal RXU3; the first upstream RF receive signal RXU1 is a midband RF signal, the second upstream RF receive signal RXU2 is a lowband RF signal, and the third upstream RF receive signal RXU3 is a highband RF signal. In a second embodiment of the first upstream RF receive signal RXU1, the second upstream RF receive signal RXU2, and the third upstream RF receive signal RXU3; the first upstream RF receive signal RXU1 is a highband RF signal, the second upstream RF receive signal RXU2 is a lowband RF signal, and the third upstream RF receive signal RXU3 is a midband RF signal.

In one embodiment of the RF receive circuitry 34, the RF receive circuitry 34 supports receive downlink carrier aggregation (RXDLCA) by simultaneously receiving and processing at least two of the first upstream RF receive signal RXU1, the second upstream RF receive signal RXU2, and the third upstream RF receive signal RXU3. The RF receive circuitry 34 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof.

In one embodiment of the RF front-end circuitry 26, any or all of the first upstream RF transmit signal TXU1, the first downstream RF transmit signal TXD1, the second upstream RF transmit signal TXU2, the second downstream RF transmit signal TXD2, the third upstream RF transmit signal TXU3, the third downstream RF transmit signal TXD3, the first upstream RF receive signal RXU1, the first downstream RF receive signal RXD1, the second upstream RF receive signal RXU2, the second downstream RF receive signal RXD2, the third upstream RF receive signal RXU3, and the third downstream RF receive signal RXD3 are omitted.

An RF duplexer is a well-known RF device in the art having a common port (not shown), a transmit signal port (not shown), and a receive signal port (not shown). Combined RF receive and transmit signals at the common port are separated into an RF receive signal at the receive signal port and an RF transmit signal at the transmit signal port. The RF duplexer is used to at least partially isolate the receive signal port from the RF transmit signal to help receive performance by avoiding receiver de-sensitization of RF receive circuitry by the RF transmit signal. The RF transmit signal and the RF receive signal are separated by a duplex frequency. Additionally, the RF transmit signal and the RF receive signal fall within one respective RF communications band.

The first RF duplexer 28 receives and provides a first RF receive signal RX1 and a first RF transmit signal TX1, respectively. In one embodiment of the first RF duplexer 28, the first RF duplexer 28 receives and provides the first RF receive signal RX1 and the first RF transmit signal TX1 simultaneously. In one embodiment of the first RF duplexer 28, the first RF receive signal RX1 and the first RF transmit signal TX1 are not received and provided simultaneously. In one embodiment of the first RF duplexer 28, the first RF receive signal RX1 is omitted. In one embodiment of the first RF duplexer 28, the first RF transmit signal TX1 is omitted. In one embodiment of the first RF duplexer 28, both the first RF receive signal RX1 and the first RF transmit signal TX1 are omitted. In one embodiment of the RF communications circuitry 10, the first RF duplexer 28 is omitted. In a first embodiment of the first RF transmit signal TX1, the first RF transmit signal TX1 is a midband RF transmit signal. In a first embodiment of the first RF receive signal RX1, the first RF receive signal RX1 is a midband RF receive signal. In a second embodiment of the first RF transmit signal TX1, the first RF transmit signal TX1 is a highband RF transmit signal. In a second embodiment of the first RF receive signal RX1, the first RF receive signal RX1 is a highband RF receive signal.

In one embodiment of the first RF duplexer 28, the first RF duplexer 28 receives and forwards the first RF receive signal RX1 to provide the first upstream RF receive signal RXU1. In one embodiment of the first RF duplexer 28, the first RF duplexer 28 receives and forwards the first downstream RF transmit signal TXD1 to provide the first RF transmit signal TX1. In one embodiment of the first RF duplexer 28, the first RF duplexer 28 at least partially isolates the first downstream RF transmit signal TXD1 and the first RF transmit signal TX1 from the RF receive circuitry 34.

The second RF duplexer 30 receives and provides a second RF receive signal RX2 and a second RF transmit signal TX2, respectively. In one embodiment of the second RF duplexer 30, the second RF duplexer 30 receives and provides the second RF receive signal RX2 and the second RF transmit signal TX2 simultaneously. In one embodiment of the second RF duplexer 30, the second RF receive signal RX2 and the second RF transmit signal TX2 are not received and provided simultaneously. In one embodiment of the second RF duplexer 30, the second RF receive signal RX2 is omitted. In one embodiment of the second RF duplexer 30, the second RF transmit signal TX2 is omitted. In one embodiment of the second RF duplexer 30, both the second RF receive signal RX2 and the second RF transmit signal TX2 are omitted. In one embodiment of the RF communications circuitry 10, the second RF duplexer 30 is omitted. In one embodiment of the second RF transmit signal TX2, the second RF transmit signal TX2 is a lowband RF transmit signal. In one embodiment of the second RF receive signal RX2, the second RF receive signal RX2 is a lowband RF receive signal.

In one embodiment of the second RF duplexer 30, the second RF duplexer 30 receives and forwards the second RF receive signal RX2 to provide the second upstream RF receive signal RXU2. In one embodiment of the second RF duplexer 30, the second RF duplexer 30 receives and forwards the second downstream RF transmit signal TXD2 to provide the second RF transmit signal TX2. In one embodiment of the second RF duplexer 30, the second RF duplexer 30 at least partially isolates the second downstream RF transmit signal TXD2 and the second RF transmit signal TX2 from the RF receive circuitry 34.

The third RF duplexer 32 receives and provides a third RF receive signal RX3 and a third RF transmit signal TX3, respectively. In one embodiment of the third RF duplexer 32, the third RF duplexer 32 receives and provides the third RF receive signal RX3 and the third RF transmit signal TX3 simultaneously. In one embodiment of the third RF duplexer 32, the third RF receive signal RX3 and the third RF transmit signal TX3 are not received and provided simultaneously. In one embodiment of the third RF duplexer 32, the third RF receive signal RX3 is omitted. In one embodiment of the third RF duplexer 32, the third RF transmit signal TX3 is omitted. In one embodiment of the third RF duplexer 32, both the third RF receive signal RX3 and the third RF transmit signal TX3 are omitted. In one embodiment of the RF communications circuitry 10, the third RF duplexer 32 is omitted. In a first embodiment of the third RF transmit signal TX3, the third RF transmit signal TX3 is a highband RF transmit signal. In a first embodiment of the third RF receive signal RX3, the third RF receive signal RX3 is a highband RF receive signal. In a second embodiment of the third RF transmit signal TX3, the third RF transmit signal TX3 is a midband RF transmit signal. In a second embodiment of the third RF receive signal RX3, the third RF receive signal RX3 is a midband RF receive signal.

In one embodiment of the third RF duplexer 32, the third RF duplexer 32 receives and forwards the third RF receive signal RX3 to provide the third upstream RF receive signal RXU3. In one embodiment of the third RF duplexer 32, the third RF duplexer 32 receives and forwards the third downstream RF transmit signal TXD3 to provide the third RF transmit signal TX3. In one embodiment of the third RF duplexer 32, the third RF duplexer 32 at least partially isolates the third downstream RF transmit signal TXD3 and the third RF transmit signal TX3 from the RF receive circuitry 34.

As previously mentioned, the first RF triplexer 12 has the first common port CP1, the first main port MP1, the second main port MP2, and the third main port MP3. The first common port CP1 is coupled to the first RF antenna 14. The first main port MP1 is coupled to the first RF duplexer 28. The second main port MP2 is coupled to the second RF duplexer 30. In general, in one embodiment of the first RF triplexer 12, the first RF triplexer 12 separates combined RF signals at the first common port CP1 into separate RF signals at each of the first main port MP1, the second main port MP2, and the third main port MP3.

In one embodiment of the first RF triplexer 12, RF signals at the first main port MP1 are associated with a first RF communications band, RF signals at the second main port MP2 are associated with a second RF communications band, and RF signals at the third main port MP3 are associated with a third RF communications band. Therefore, RF signals at the first common port CP1 may be associated with the first, the second, and the third RF communications bands.

By segregating the RF signals in this manner, processing of the RF signals may be simplified, may enhance RF performance, or both. As such, in one embodiment of the first RF triplexer 12, signals at the first main port MP1 are associated with a midband RF communications band, signals at the second main port MP2 are associated with a lowband RF communications band, and signals at the third main port MP3 are associated with a highband RF communications band. Therefore, signals at the first common port CP1 may be associated with the highband RF communications band, the lowband RF communications band, the midband RF communications band, or any combination thereof.

In one embodiment of the first RF triplexer 12, the first main port MP1 is substantially isolated from the second main port MP2. In one embodiment of the first RF triplexer 12, the first main port MP1 is substantially isolated from the third main port MP3. In one embodiment of the first RF triplexer 12, the third main port MP3 is substantially isolated from the second main port MP2.

The first RF triplexer 12 receives and forwards the first RF transmit signal TX1 via the first main port MP1 to the first common port CP1 to provide a first RF antenna transmit signal TXA1. In one embodiment of the first RF transmit signal TX1, the first RF transmit signal TX1 is a midband RF transmit signal. In one embodiment of the first RF antenna transmit signal TXA1, the first RF antenna transmit signal TXA1 is a highband RF antenna transmit signal.

The first RF triplexer 12 receives and forwards the second RF transmit signal TX2 via the second main port MP2 to the first common port CP1 to provide a second RF antenna transmit signal TXA2. In one embodiment of the second RF transmit signal TX2, the second RF transmit signal TX2 is a lowband RF transmit signal.

The first RF triplexer 12 receives and forwards the third RF transmit signal TX3 via the third main port MP3 to the first common port CP1 to provide a third RF antenna transmit signal TXA3. In one embodiment of the third RF transmit signal TX3, the third RF transmit signal TX3 is a highband RF transmit signal. In one embodiment of the third RF antenna transmit signal TXA3, the third RF antenna transmit signal TXA3 is a midband RF antenna transmit signal.

In one embodiment of the first RF triplexer 12, the first RF triplexer 12 establishes TXULCA by providing the at least two of the lowband RF transmit signal, the midband RF transmit signal, and the highband RF transmit signal simultaneously. As such, the lowband RF antenna transmit signal, the midband RF transmit signal, and the highband RF antenna transmit signal are TXULCA signals.

In one embodiment of the first RF triplexer 12, the highband RF antenna transmit signal and the midband RF transmit signal are both substantially isolated from the second main port MP2; and the lowband RF antenna transmit signal is substantially isolated from both the first main port MP1 and the third main port MP3.

In one embodiment of the first RF triplexer 12, the highband RF antenna transmit signal and the lowband RF transmit signal are both substantially isolated from the first main port MP1; and the midband RF antenna transmit signal is substantially isolated from both the second main port MP2 and the third main port MP3.

In one embodiment of the first RF triplexer 12, the midband RF antenna transmit signal and the lowband RF transmit signal are both substantially isolated from the first main port MP1; and the highband RF antenna transmit signal is substantially isolated from both the second main port MP2 and the third main port MP3.

The first RF triplexer 12 receives and forwards a first RF antenna receive signal RXA1 via the first RF antenna 14 to the first main port MP1 to provide the first RF receive signal RX1. In one embodiment of the first RF antenna receive signal RXA1, the first RF antenna receive signal RXA1 is a highband RF antenna receive signal. In one embodiment of the first RF receive signal RX1, the first RF receive signal RX1 is a highband RF receive signal. In an alternate embodiment of the first RF antenna receive signal RXA1, the first RF antenna receive signal RXA1 is a midband RF antenna receive signal. In an alternate embodiment of the first RF receive signal RX1, the first RF receive signal RX1 is a midband RF receive signal.

The first RF triplexer 12 receives and forwards a second RF antenna receive signal RXA2 via the first RF antenna 14 to the second main port MP2 to provide the second RF receive signal RX2. In one embodiment of the second RF antenna receive signal RXA2, the second RF antenna receive signal RXA2 is a lowband RF antenna receive signal. In one embodiment of the second RF receive signal RX2, the second RF receive signal RX2 is a lowband RF receive signal.

The first RF triplexer 12 receives and forwards a third RF antenna receive signal RXA3 via the first RF antenna 14 to the third main port MP3 to provide the third RF receive signal RX3. In one embodiment of the third RF antenna receive signal RXA3, the third RF antenna receive signal RXA3 is a highband RF antenna receive signal. In one embodiment of the third RF receive signal RX3, the third RF receive signal RX3 is a highband RF receive signal. In an alternate embodiment of the third RF antenna receive signal RXA3, the third RF antenna receive signal RXA3 is a midband RF antenna receive signal. In an alternate embodiment of the third RF receive signal RX3, the third RF receive signal RX3 is a midband RF receive signal.

In one embodiment of the first RF triplexer 12, the first RF triplexer 12 establishes RXDLCA by receiving at least two of the highband RF antenna receive signal, the lowband RF antenna receive signal, and the midband RF antenna receive signal simultaneously. As such, the at least two of the highband RF antenna receive signal, the lowband RF antenna receive signal, and the midband RF antenna receive signal are RXDLCA signals.

In one embodiment of the RF front-end circuitry 26, any or all of the first RF transmit signal TX1, the second RF transmit signal TX2, the third RF transmit signal TX3, the first RF antenna transmit signal TXA1, the second RF antenna transmit signal TXA2, the third RF antenna transmit signal TXA3, the first RF receive signal RX1, the second RF receive signal RX2, the third RF receive signal RX3, the first RF antenna receive signal RXA1, the second RF antenna receive signal RXA2, and the third RF antenna receive signal RXA3 are omitted.

In one embodiment of the RF system control circuitry 24 and the first RF triplexer 12, the RF system control circuitry 24 provides the first function configuration signal FCS1 to the first RF triplexer 12. As such, the RF system control circuitry 24 may configure, tune, adjust, enable, disable, vary, or any combination thereof, circuits within the first RF triplexer 12 as necessary using the first function configuration signal FCS1.

Figure 3:
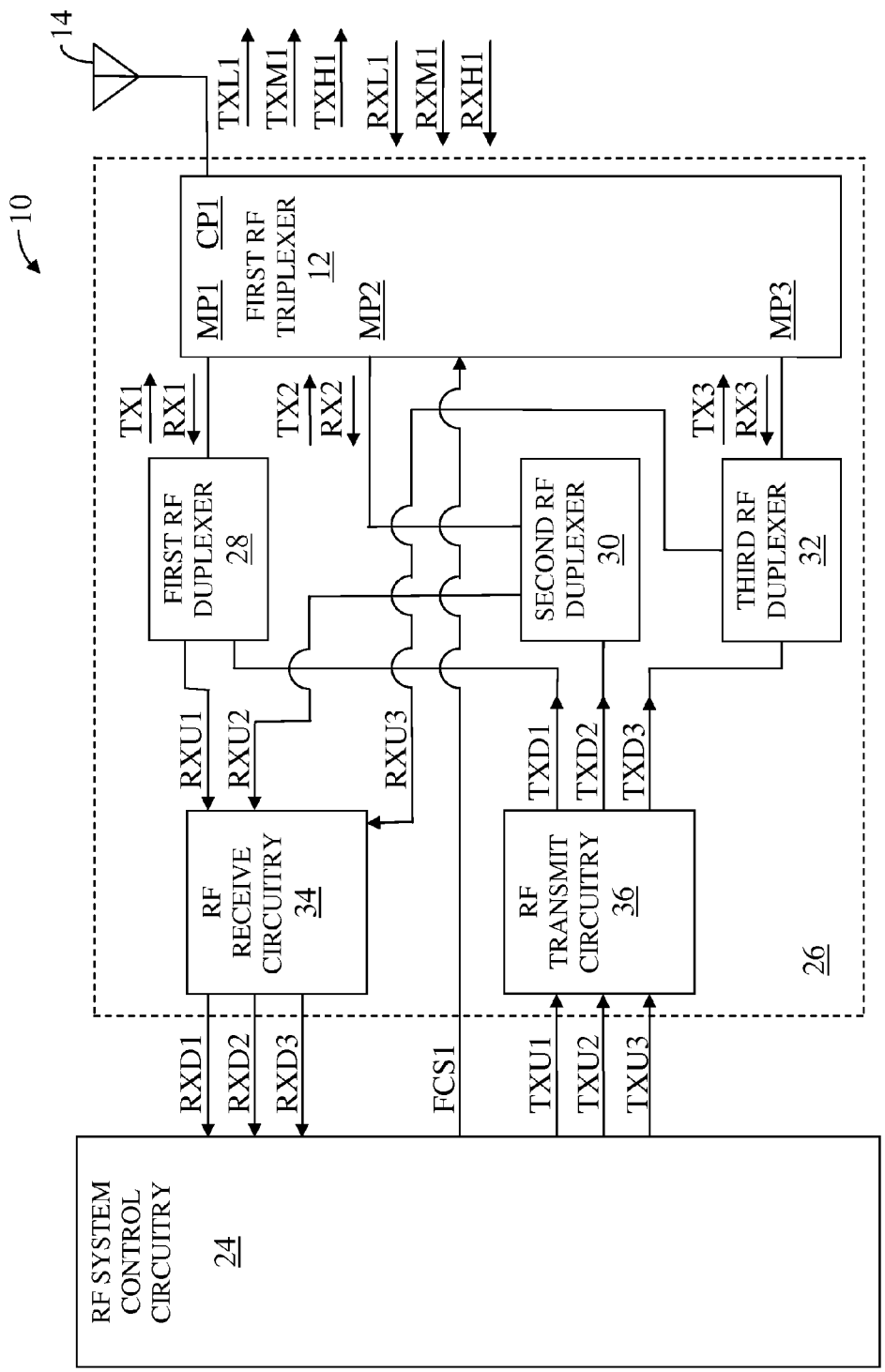
FIG. 3 shows the RF communications circuitry according to an additional embodiment of the RF communications circuitry.

FIG. 3 shows the RF communications circuitry 10 according to an additional embodiment of the RF communications circuitry 10. The RF communications circuitry 10 illustrated in FIG. 3 is similar to the RF communications circuitry 10 illustrated in FIG. 2, except in the RF communications circuitry 10 illustrated in FIG. 3, the first RF antenna receive signal RXA1, the second RF antenna receive signal RXA2, the third RF antenna receive signal RXA3, the first RF antenna transmit signal TXA1, the second RF antenna transmit signal TXA2, and the third RF antenna transmit signal TXA3 are not shown.

In one embodiment of the RF communications circuitry 10 illustrated in FIG. 3, the first RF triplexer 12 receives at least one of a first lowband RF receive signal RXL1, a first midband RF receive signal RXM1, and a first highband RF receive signal RXH1 via the first RF antenna 14. Additionally, the first RF triplexer 12 transmits at least one of a first lowband RF transmit signal TXL1, a first midband RF transmit signal TXM1, and a first highband RF transmit signal TXH1 via the first RF antenna 14.

In one embodiment of the first lowband RF receive signal RXL1, the first lowband RF receive signal RXL1 is the second RF antenna receive signal RXA2 (FIG. 2). In one embodiment of the first lowband RF transmit signal TXL1, the first lowband RF transmit signal TXL1 is second RF antenna transmit signal TXA2 (FIG. 2).

In one embodiment of the first midband RF receive signal RXM1, the first midband RF receive signal RXM1 is the first RF antenna receive signal RXA1 (FIG. 2). In one embodiment of the first midband RF transmit signal TXM1, the first midband RF transmit signal TXM1 is the first RF antenna transmit signal TXA1 (FIG. 2). In an alternate embodiment of the first midband RF receive signal RXM1, the first midband RF receive signal RXM1 is the third RF antenna receive signal RXA3 (FIG. 2). In an alternate embodiment of the first midband RF transmit signal TXM1, the first midband RF transmit signal TXM1 is the third RF antenna transmit signal TXA3 (FIG. 2).

In one embodiment of the first highband RF receive signal RXH1, the first highband RF receive signal RXH1 is the third RF antenna receive signal RXA3 (FIG. 2). In one embodiment of the first highband RF transmit signal TXH1, the first highband RF transmit signal TXH1 is the third RF antenna transmit signal TXA3 (FIG. 2). In an alternate embodiment of the first highband RF receive signal RXH1, the first highband RF receive signal RXH1 is the first RF antenna receive signal RXA1 (FIG. 2). In an alternate embodiment of the first highband RF transmit signal TXH1, the first highband RF transmit signal TXH1 is the first RF antenna transmit signal TXA1 (FIG. 2).

By definition, a carrier frequency of the first midband RF transmit signal TXM1 is greater than a carrier frequency of the first lowband RF transmit signal TXL1. By definition, a carrier frequency of the first highband RF transmit signal TXH1 is greater than the carrier frequency of the first midband RF transmit signal TXM1. As such, by definition, the carrier frequency of the first highband RF transmit signal TXH1 is greater than the carrier frequency of the first lowband RF transmit signal TXL1.

By definition, a carrier frequency of the first midband RF receive signal RXM1 is greater than a carrier frequency of the first lowband RF receive signal RXL1. By definition, a carrier frequency of the first highband RF receive signal RXH1 is greater than the carrier frequency of the first midband RF receive signal RXM1. As such, by definition, the carrier frequency of the first highband RF receive signal RXH1 is greater than the carrier frequency of the first lowband RF receive signal RXL1.

In one embodiment of the first lowband RF receive signal RXL1, the carrier frequency of the first lowband RF receive signal RXL1 is greater than about 600 megahertz. In one embodiment of the first lowband RF receive signal RXL1, the carrier frequency of the first lowband RF receive signal RXL1 is less than about 1000 megahertz. In one embodiment of the first lowband RF receive signal RXL1, the carrier frequency of the first lowband RF receive signal RXL1 is greater than about 690 megahertz. In one embodiment of the first lowband RF receive signal RXL1, the carrier frequency of the first lowband RF receive signal RXL1 is less than about 960 megahertz.

In one embodiment of the first midband RF receive signal RXM1, the carrier frequency of the first midband RF receive signal RXM1 is greater than about 1000 megahertz. In one embodiment of the first midband RF receive signal RXM1, the carrier frequency of the first midband RF receive signal RXM1 is less than about 2250 megahertz. In one embodiment of the first midband RF receive signal RXM1, the carrier frequency of the first midband RF receive signal RXM1 is greater than about 1420 megahertz. In one embodiment of the first midband RF receive signal RXM1, the carrier frequency of the first midband RF receive signal RXM1 is less than about 2250 megahertz.

In one embodiment of the first highband RF receive signal RXH1, the carrier frequency of the first highband RF receive signal RXH1 is greater than about 2250 megahertz. In one embodiment of the first highband RF receive signal RXH1, the carrier frequency of the first highband RF receive signal RXH1 is less than about 5500 megahertz. In one embodiment of the first highband RF receive signal RXH1, the carrier frequency of the first highband RF receive signal RXH1 is less than about 4000 megahertz.

In one embodiment of the first lowband RF transmit signal TXL1, the carrier frequency of the first lowband RF transmit signal TXL1 is greater than about 600 megahertz. In one embodiment of the first lowband RF transmit signal TXL1, the carrier frequency of the first lowband RF transmit signal TXL1 is less than about 1000 megahertz. In one embodiment of the first lowband RF transmit signal TXL1, the carrier frequency of the first lowband RF transmit signal TXL1 is greater than about 690 megahertz. In one embodiment of the first lowband RF transmit signal TXL1, the carrier frequency of the first lowband RF transmit signal TXL1 is less than about 960 megahertz.

In one embodiment of the first midband RF transmit signal TXM1, the carrier frequency of the first midband RF transmit signal TXM1 is greater than about 1000 megahertz. In one embodiment of the first midband RF transmit signal TXM1, the carrier frequency of the first midband RF transmit signal TXM1 is less than about 2250 megahertz. In one embodiment of the first midband RF transmit signal TXM1, the carrier frequency of the first midband RF transmit signal TXM1 is greater than about 1420 megahertz. In one embodiment of the first midband RF transmit signal TXM1, the carrier frequency of the first midband RF transmit signal TXM1 is less than about 2250 megahertz.

In one embodiment of the first highband RF transmit signal TXH1, the carrier frequency of the first highband RF transmit signal TXH1 is greater than about 2250 megahertz. In one embodiment of the first highband RF transmit signal TXH1, the carrier frequency of the first highband RF transmit signal TXH1 is less than about 5500 megahertz. In one embodiment of the first highband RF transmit signal TXH1, the carrier frequency of the first highband RF transmit signal TXH1 is less than about 4000 megahertz.

In one embodiment of the first lowband RF receive signal RXL1, the first midband RF receive signal RXM1, and the first highband RF receive signal RXH1; at least two of the first lowband RF receive signal RXL1, the first midband RF receive signal RXM1, and the first highband RF receive signal RXH1 are RXDLCA signals. In one embodiment of the first lowband RF receive signal RXL1, the first midband RF receive signal RXM1, and the first highband RF receive signal RXH1; the first lowband RF receive signal RXL1, the first midband RF receive signal RXM1, and the first highband RF receive signal RXH1 are RXDLCA signals.

In one embodiment of the first lowband RF transmit signal TXL1, the first midband RF transmit signal TXM1, and the first highband RF transmit signal TXH1; at least two of the first lowband RF transmit signal TXL1, the first midband RF transmit signal TXM1, and the first highband RF transmit signal TXH1 are TXULCA signals. In one embodiment of the first lowband RF transmit signal TXL1, the first midband RF transmit signal TXM1, and the first highband RF transmit signal TXH1; the first lowband RF transmit signal TXL1, the first midband RF transmit signal TXM1, and the first highband RF transmit signal TXH1 are TXULCA signals.

In an alternate embodiment of the RF communications circuitry 10, any of the first lowband RF receive signal RXL1, the first midband RF receive signal RXM1, the first highband RF receive signal RXH1, the first lowband RF transmit signal TXL1, the first midband RF transmit signal TXM1, and the first highband RF transmit signal TXH1 are omitted.

Figure 4:
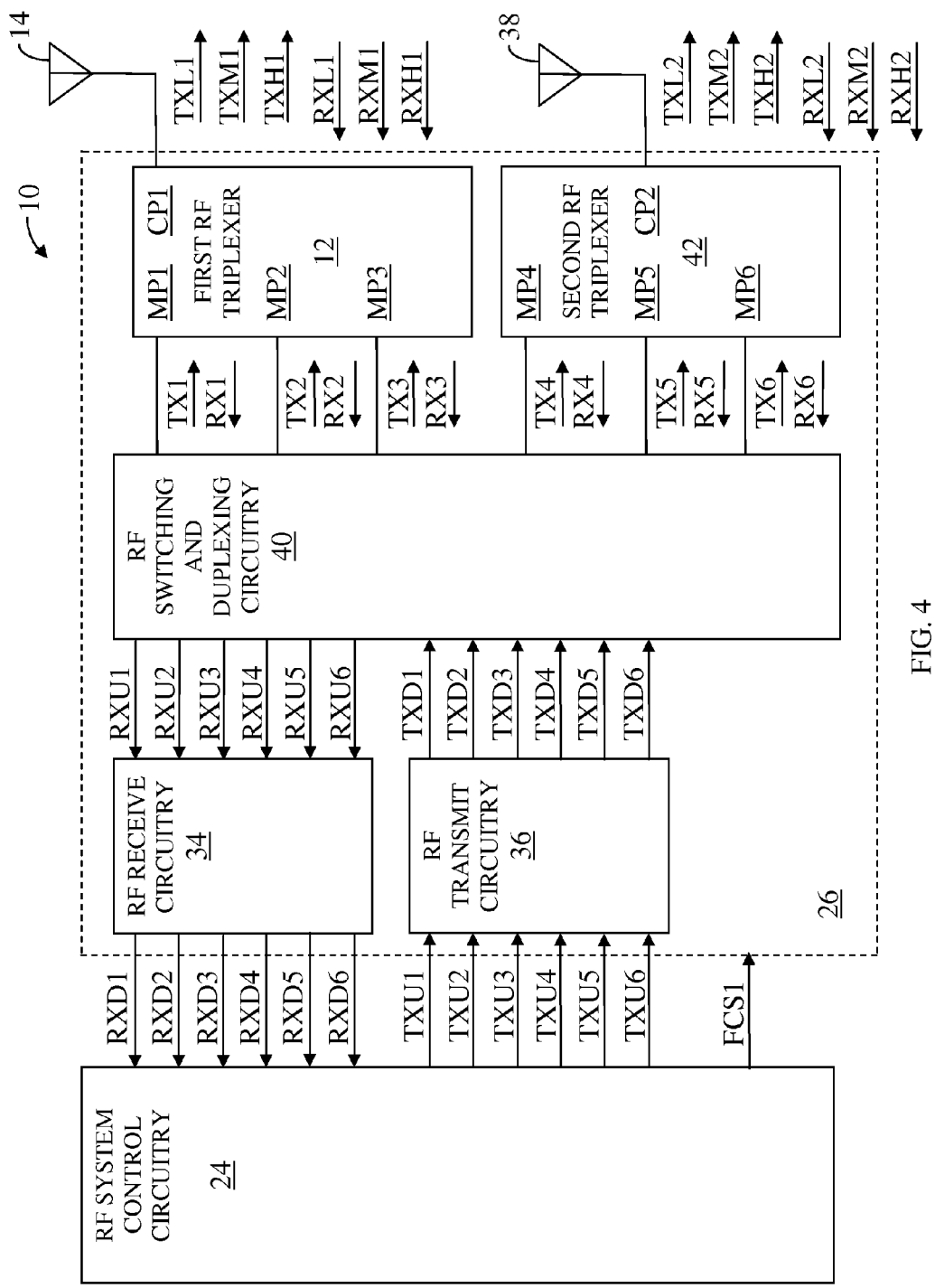
FIG. 4 shows the RF communications circuitry according to another embodiment of the RF communications circuitry.

FIG. 4 shows the RF communications circuitry 10 according to another embodiment of the RF communications circuitry 10. The RF communications circuitry 10 illustrated in FIG. 4 is similar to the RF communications circuitry 10 illustrated in FIG. 3, except the RF communications circuitry 10 illustrated in FIG. 4 further includes a second RF antenna 38. Additionally, the RF front-end circuitry 26 further includes RF switching and duplexing circuitry 40 and a second RF triplexer 42.

The RF switching and duplexing circuitry 40 is coupled to the first RF triplexer 12, the RF receive circuitry 34, the RF transmit circuitry 36, and the second RF triplexer 42. As such, in one embodiment of the RF switching and duplexing circuitry 40, the RF switching and duplexing circuitry 40 includes the first RF duplexer 28 (FIG. 3), the second RF duplexer 30 (FIG. 3), and the third RF duplexer 32 (FIG. 3). Additionally, the RF switching and duplexing circuitry 40 may include additional duplexers (not shown), switching circuitry (not shown), or other circuitry as needed.

The RF transmit circuitry 36 further receives and processes a fourth upstream RF transmit signal TXU4, a fifth upstream RF transmit signal TXU5, and a sixth upstream RF transmit signal TXU6 from the RF system control circuitry 24 to provide a fourth downstream RF transmit signal TXD4, a fifth downstream RF transmit signal TXD5, and a sixth downstream RF transmit signal TXD6 to the RF switching and duplexing circuitry 40. The fourth, fifth, and sixth downstream RF transmit signals TXD4, TXD5, TXD6 may be similar to corresponding first, second, and third downstream RF transmit signals TXD1, TXD2, TXD3.

The RF receive circuitry 34 further receives and processes a fourth upstream RF receive signal RXU4, a fifth upstream RF receive signal RXU5, and a sixth upstream RF receive signal RXU6 from the RF switching and duplexing circuitry 40 to provide a fourth downstream RF receive signal RXD4, a fifth downstream RF receive signal RXD5, and a sixth downstream RF receive signal RXD6 to the RF system control circuitry 24. The fourth, fifth, and sixth downstream RF receive signals RXD4, RXD5, RXD6 may be similar to corresponding first, second, and third downstream RF receive signals RXD1, RXD2, RXD3.

The second RF triplexer 42 has a second common port CP2, a fourth main port MP4, a fifth main port MP5, and a sixth main port MP6. The second RF antenna 38 is coupled to the second common port CP2. The fourth main port MP4, the fifth main port MP5, and the sixth main port MP6 are coupled to the RF switching and duplexing circuitry 40. The fourth main port MP4 may perform similarly to the first main port MP1. The fifth main port MP5 may perform similarly to the second main port MP2. The sixth main port MP6 may perform similarly to the third main port MP3.

As such, the second RF triplexer 42 may perform similarly to the first RF triplexer 12. In this regard, a fourth RF transmit signal TX4 may be similar to the first RF transmit signal TX1; a fifth RF transmit signal TX5 may be similar to the second RF transmit signal TX2; a sixth RF transmit signal TX6 may be similar to the third RF transmit signal TX3; a fourth RF receive signal RX4 may be similar to the first RF receive signal RX1; a fifth RF receive signal RX5 may be similar to the second RF receive signal RX2; and a sixth RF receive signal RX6 may be similar to the third RF receive signal RX3.

Further, a second lowband RF receive signal RXL2 may be similar to the first lowband RF receive signal RXL1; a second midband RF receive signal RXM2 may be similar to the first midband RF receive signal RXM1; a second highband RF receive signal RXH2 may be similar to the first highband RF receive signal RXH1; a second lowband RF transmit signal TXL2 may be similar to the first lowband RF transmit signal TXL1; a second midband RF transmit signal TXM2 may be similar to the first midband RF transmit signal TXM1; and a second highband RF transmit signal TXH2 may be similar to the first highband RF transmit signal TXH1.

In one embodiment of the second RF triplexer 42, the second RF triplexer 42 receives the second lowband RF receive signal RXL2 via the second RF antenna 38. In one embodiment of the second RF triplexer 42, the second RF triplexer 42 receives the second midband RF receive signal RXM2 via the second RF antenna 38. In one embodiment of the second RF triplexer 42, the second RF triplexer 42 receives the second highband RF receive signal RXH2 via the second RF antenna 38.

In one embodiment of the second RF triplexer 42, the second RF triplexer 42 transmits the second lowband RF transmit signal TXL2 via the second RF antenna 38. In one embodiment of the second RF triplexer 42, the second RF triplexer 42 transmits the second midband RF transmit signal TXM2 via the second RF antenna 38. In one embodiment of the second RF triplexer 42, the second RF triplexer 42 transmits the second highband RF transmit signal TXH2 via the second RF antenna 38.

In one embodiment of the first RF antenna 14, the first RF antenna 14 is a primary RF antenna. In one embodiment of the second RF antenna 38, the second RF antenna 38 is a secondary RF antenna. In one embodiment of the RF communications circuitry 10, one of the first highband RF transmit signal TXH1 and the second highband RF transmit signal TXH2 is a primary highband RF transmit signal and another of the first highband RF transmit signal TXH1 and the second highband RF transmit signal TXH2 is a diversity highband RF transmit signal.

In one embodiment of the RF communications circuitry 10, one of the first midband RF transmit signal TXM1 and the second midband RF transmit signal TXM2 is a primary midband RF transmit signal and another of the first midband RF transmit signal TXM1 and the second midband RF transmit signal TXM2 is a diversity midband RF transmit signal. In one embodiment of the RF communications circuitry 10, one of the second lowband RF transmit signal TXL2 and the first lowband RF transmit signal TXL1 is a primary lowband RF transmit signal and another of the second lowband RF transmit signal TXL2 and the first lowband RF transmit signal TXL1 is a diversity lowband RF transmit signal.

In one embodiment of the RF communications circuitry 10, one of the second highband RF receive signal RXH2 and the first highband RF receive signal RXH1 is a primary highband RF receive signal and another of the second highband RF receive signal RXH2 and the first highband RF receive signal RXH1 is a diversity highband RF receive signal. In one embodiment of the RF communications circuitry 10, one of the first midband RF receive signal RXM1 and the second midband RF receive signal RXM2 is a primary midband RF receive signal and another of the first midband RF receive signal RXM1 and the second midband RF receive signal RXM2 is a diversity midband RF receive signal.

In one embodiment of the RF communications circuitry 10, one of the first lowband RF receive signal RXL1 and the second lowband RF receive signal RXL2 is a primary lowband RF receive signal and another of the first lowband RF receive signal RXL1 and the second lowband RF receive signal RXL2 is a diversity lowband RF receive signal.

In one embodiment of the RF communications circuitry 10, any of the first highband RF transmit signal TXH1, the first midband RF transmit signal TXM1, the first lowband RF transmit signal TXL1, the first highband RF receive signal RXH1, the first midband RF receive signal RXM1, the first lowband RF receive signal RXL1, the second highband RF transmit signal TXH2, the second midband RF transmit signal TXM2, the second lowband RF transmit signal TXL2, the second highband RF receive signal RXH2, the second midband RF receive signal RXM2, and the second lowband RF receive signal RXL2 is omitted.

Figure 5:
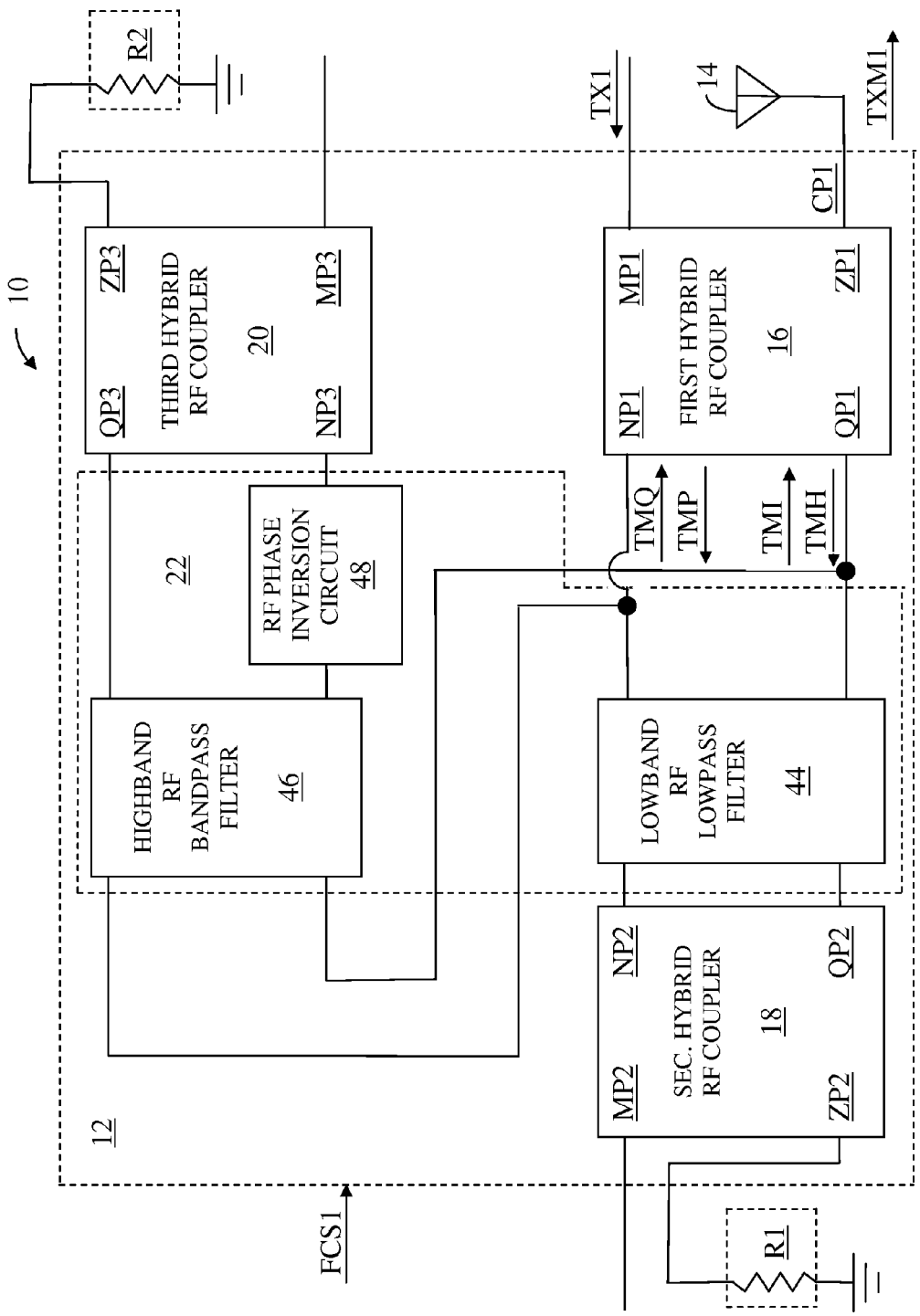
FIG. 5 shows details of a first RF triplexer illustrated in FIG. 1 according to one embodiment of the first RF triplexer.

FIG. 5 shows details of the first RF triplexer 12 illustrated in FIG. 1 according to one embodiment of the first RF triplexer 12. The first RF filter circuitry 22 includes a lowband RF lowpass filter 44, a highband RF bandpass filter 46, and an RF phase inversion circuit 48. The lowband RF lowpass filter 44 is coupled between the second hybrid RF coupler 18 and the first hybrid RF coupler 16. In one embodiment of the lowband RF lowpass filter 44, a break frequency of the lowband RF lowpass filter 44 is tunable based on the first function configuration signal FCS1. In one embodiment of the first RF triplexer 12, the RF system control circuitry 24 (FIG. 3) selects the break frequency of the lowband RF lowpass filter 44 using the first function configuration signal FCS1.

The highband RF bandpass filter 46 and the RF phase inversion circuit 48 are coupled in series between the third hybrid RF coupler 20 and the first hybrid RF coupler 16. In one embodiment of the highband RF bandpass filter 46, a frequency response of the highband RF bandpass filter 46 is tunable based on the first function configuration signal FCS1. In one embodiment of the first RF triplexer 12, the RF system control circuitry 24 (FIG. 3) selects the frequency response of the highband RF bandpass filter 46 using the first function configuration signal FCS1.

The first hybrid RF coupler 16 transmits the first midband RF transmit signal TXM1 via the first RF antenna 14 using the first RF transmit signal TX1. As such, the first hybrid RF coupler 16 receives, splits, and phase-shifts the first RF transmit signal TX1 to provide a midband quadrature-phase feeder RF transmit signal TMP via the first in-phase port NP1 and a midband in-phase feeder RF transmit signal TMH via the first quadrature-phase port QP1. In one embodiment of the midband quadrature-phase feeder RF transmit signal TMP and the midband in-phase feeder RF transmit signal TMH, the midband quadrature-phase feeder RF transmit signal TMP is phase-shifted from the midband in-phase feeder RF transmit signal TMH by about 90 degrees.

The lowband RF lowpass filter 44 and the highband RF bandpass filter 46 present about high impedances to the first hybrid RF coupler 16 at the carrier frequency of the first midband RF transmit signal TXM1. As a result, the midband quadrature-phase feeder RF transmit signal TMP and the midband in-phase feeder RF transmit signal TMH are substantially reflected back to provide a midband quadrature-phase RF transmit signal TMQ and a midband in-phase RF transmit signal TMI, respectively, to the first in-phase port NP1 and the first quadrature-phase port QP1, respectively. The first hybrid RF coupler 16 receives, phase-shifts, and combines the midband quadrature-phase RF transmit signal TMQ and the midband in-phase RF transmit signal TMI to provide the first midband RF transmit signal TXM1.

Since the lowband RF lowpass filter 44 and the highband RF bandpass filter 46 present about high impedances to the first hybrid RF coupler 16 at the carrier frequency of the first midband RF transmit signal TXM1, the first main port MP1 is substantially isolated from the second main port MP2 and the first main port MP1 is substantially isolated from the third main port MP3 at the carrier frequency of the first midband RF transmit signal TXM1.

Figure 6:
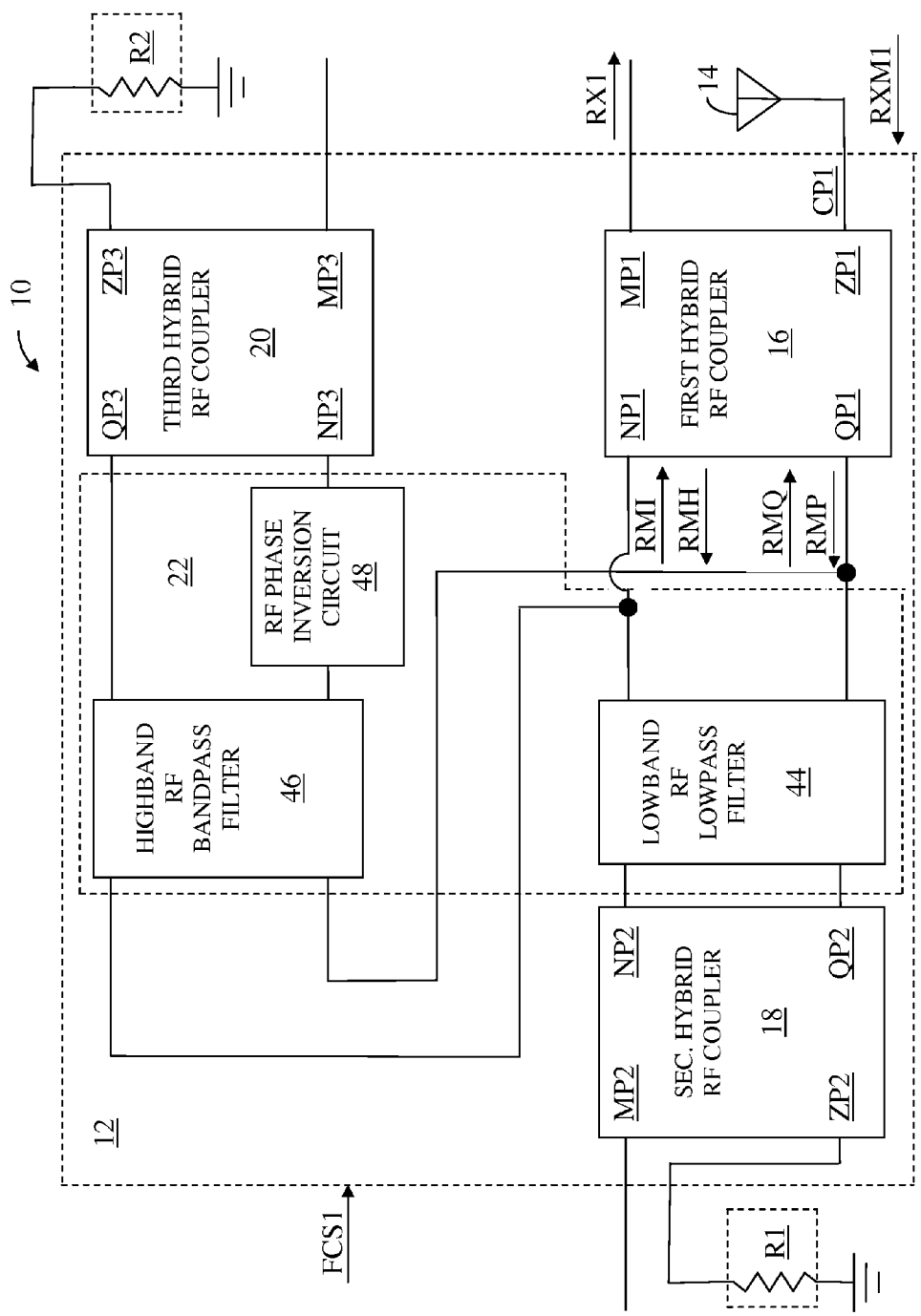
FIG. 6 shows details of the first RF triplexer illustrated in FIG. 1 according to an alternate embodiment of the first RF triplexer.

FIG. 6 shows details of the first RF triplexer 12 illustrated in FIG. 1 according to an alternate embodiment of the first RF triplexer 12. The first RF triplexer 12 illustrated in FIG. 6 is similar to the first RF triplexer 12 illustrated in FIG. 5, except in the first RF triplexer 12 illustrated in FIG. 6, the first hybrid RF coupler 16 receives the first midband RF receive signal RXM1 via the first RF antenna 14 to provide the first RF receive signal RX1.

The first hybrid RF coupler 16 receives, splits, and phase-shifts the first midband RF receive signal RXM1 to provide a midband quadrature-phase feeder RF receive signal RMP via the first quadrature-phase port QP1 and a midband in-phase feeder RF receive signal RMH via the first in-phase port NP1. In one embodiment of the midband quadrature-phase feeder RF receive signal RMP and the midband in-phase feeder RF receive signal RMH, the midband quadrature-phase feeder RF receive signal RMP is phase-shifted from the midband in-phase feeder RF receive signal RMH by about 90 degrees.

The lowband RF lowpass filter 44 and the highband RF bandpass filter 46 present about high impedances to the first hybrid RF coupler 16 at the carrier frequency of the first midband RF receive signal RXM1. As a result, the midband quadrature-phase feeder RF receive signal RMP and the midband in-phase feeder RF receive signal RMH are substantially reflected back to provide a midband quadrature-phase RF receive signal RMQ and a midband in-phase RF receive signal RMI, respectively, to the first quadrature-phase port QP1 and the first in-phase port NP1, respectively.

The first hybrid RF coupler 16 receives, phase-shifts, and combines the midband quadrature-phase RF receive signal RMQ and the midband in-phase RF receive signal RMI to provide the first RF receive signal RX1.

Since the lowband RF lowpass filter 44 and the highband RF bandpass filter 46 present about high impedances to the first hybrid RF coupler 16 at the carrier frequency of the first midband RF receive signal RXM1, the first main port MP1 is substantially isolated from the second main port MP2 and the first main port MP1 is substantially isolated from the third main port MP3 at the carrier frequency of the first midband RF receive signal RXM1.

Figure 7:
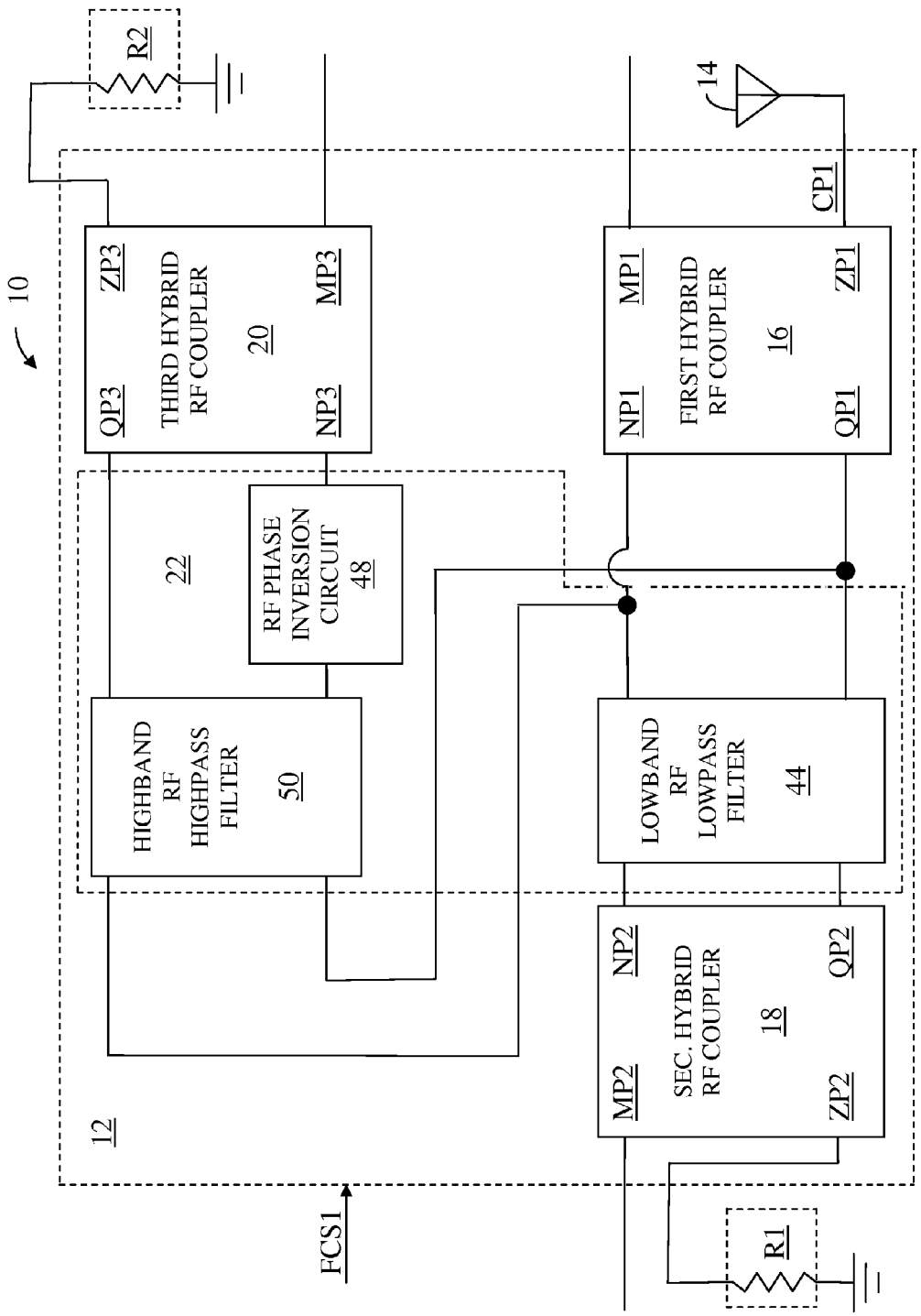
FIG. 7 shows details of the first RF triplexer illustrated in FIG. 1 according to an additional embodiment of the first RF triplexer.

FIG. 7 shows details of the first RF triplexer 12 illustrated in FIG. 1 according to an additional embodiment of the first RF triplexer 12. The first RF triplexer 12 illustrated in FIG. 7 is similar to the first RF triplexer 12 illustrated in FIGS. 5 and 6, except in the first RF triplexer 12 illustrated in FIG. 7, the highband RF bandpass filter 46 is replaced with a highband RF highpass filter 50. In this regard, the highband RF highpass filter 50 and the RF phase inversion circuit 48 are coupled in series between the third hybrid RF coupler 20 and the first hybrid RF coupler 16. In one embodiment of the highband RF highpass filter 50, a break frequency of the highband RF highpass filter 50 is tunable based on the first function configuration signal FCS1.

Figure 8:
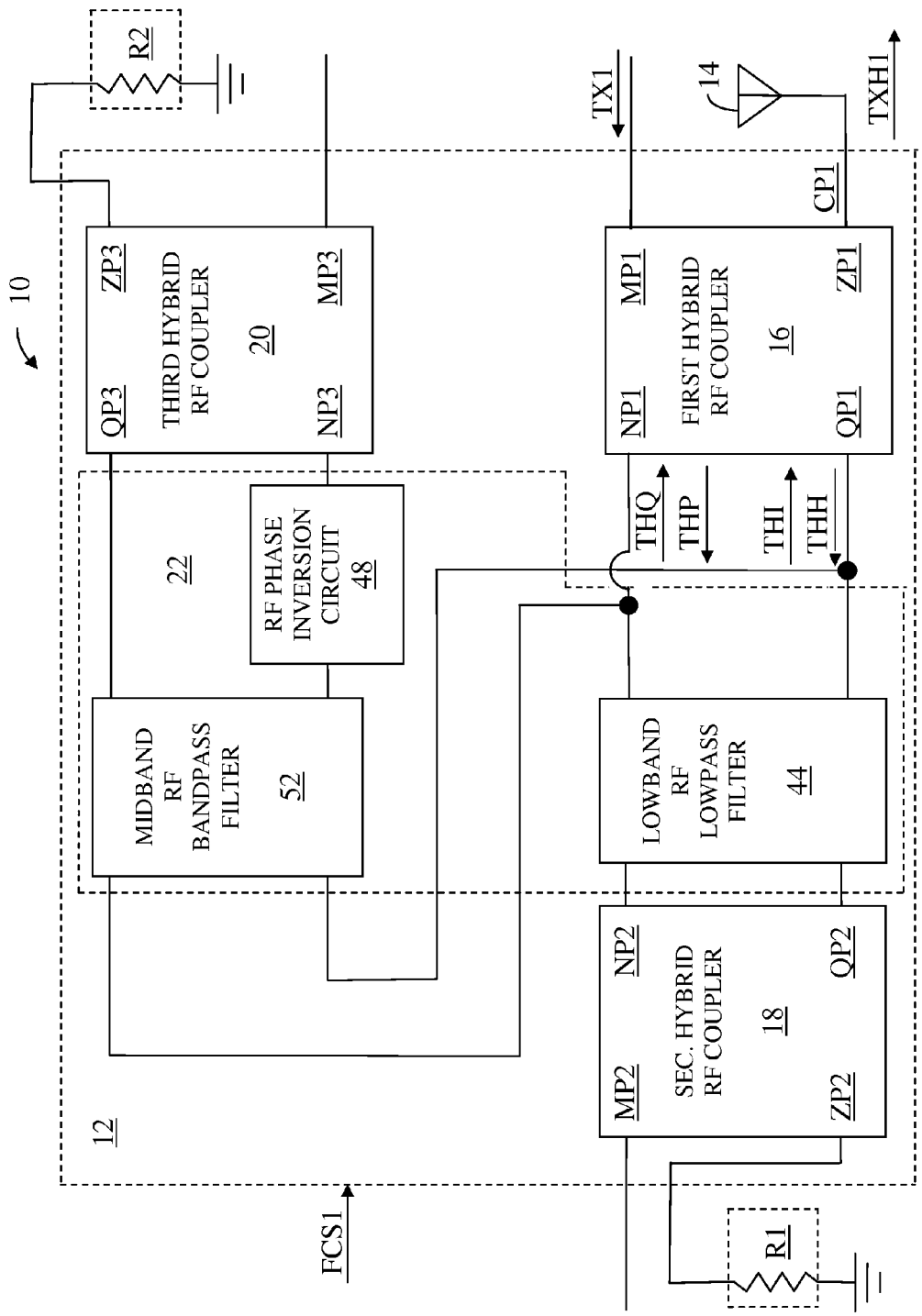
FIG. 8 shows details of the first RF triplexer illustrated in FIG. 1 according to another embodiment of the first RF triplexer.

FIG. 8 shows details of the first RF triplexer 12 illustrated in FIG. 1 according to another embodiment of the first RF triplexer 12. The first RF triplexer 12 illustrated in FIG. 8 is similar to the first RF triplexer 12 illustrated in FIG. 5, except in the first RF triplexer 12 illustrated in FIG. 8, the highband RF bandpass filter 46 is replaced with a midband RF bandpass filter 52.

The midband RF bandpass filter 52 and the RF phase inversion circuit 48 are coupled in series between the third hybrid RF coupler 20 and the first hybrid RF coupler 16. In one embodiment of the midband RF bandpass filter 52, a frequency response of the midband RF bandpass filter 52 is tunable based on the first function configuration signal FCS1. In one embodiment of the first RF triplexer 12, the RF system control circuitry 24 (FIG. 3) selects the frequency response of the midband RF bandpass filter 52 using the first function configuration signal FCS1.

The first hybrid RF coupler 16 transmits the first highband RF transmit signal TXH1 via the first RF antenna 14 using the first RF transmit signal TX1. As such, the first hybrid RF coupler 16 receives, splits, and phase-shifts the first RF transmit signal TX1 to provide a highband quadrature-phase feeder RF transmit signal THP via the first in-phase port NP1 and a highband in-phase feeder RF transmit signal THH via the first quadrature-phase port QP1. In one embodiment of the highband quadrature-phase feeder RF transmit signal THP and the highband in-phase feeder RF transmit signal THH, the highband quadrature-phase feeder RF transmit signal THP is phase-shifted from the highband in-phase feeder RF transmit signal THH by about 90 degrees.

The lowband RF lowpass filter 44 and the midband RF bandpass filter 52 present about high impedances to the first hybrid RF coupler 16 at the carrier frequency of the first highband RF transmit signal TXH1. As a result, the highband quadrature-phase feeder RF transmit signal THP and the highband in-phase feeder RF transmit signal THH are substantially reflected back to provide a highband quadrature-phase RF transmit signal THQ and a highband in-phase RF transmit signal THI, respectively, to the first in-phase port NP1 and the first quadrature-phase port QP1, respectively. The first hybrid RF coupler 16 receives, phase-shifts, and combines the highband quadrature-phase RF transmit signal THQ and the highband in-phase RF transmit signal THI to provide the first highband RF transmit signal TXH1.

Since the lowband RF lowpass filter 44 and the midband RF bandpass filter 52 present about high impedances to the first hybrid RF coupler 16 at the carrier frequency of the first highband RF transmit signal TXH1, the first main port MP1 is substantially isolated from the second main port MP2 and the first main port MP1 is substantially isolated from the third main port MP3 at the carrier frequency of the first highband RF transmit signal TXH1.

Figure 9:
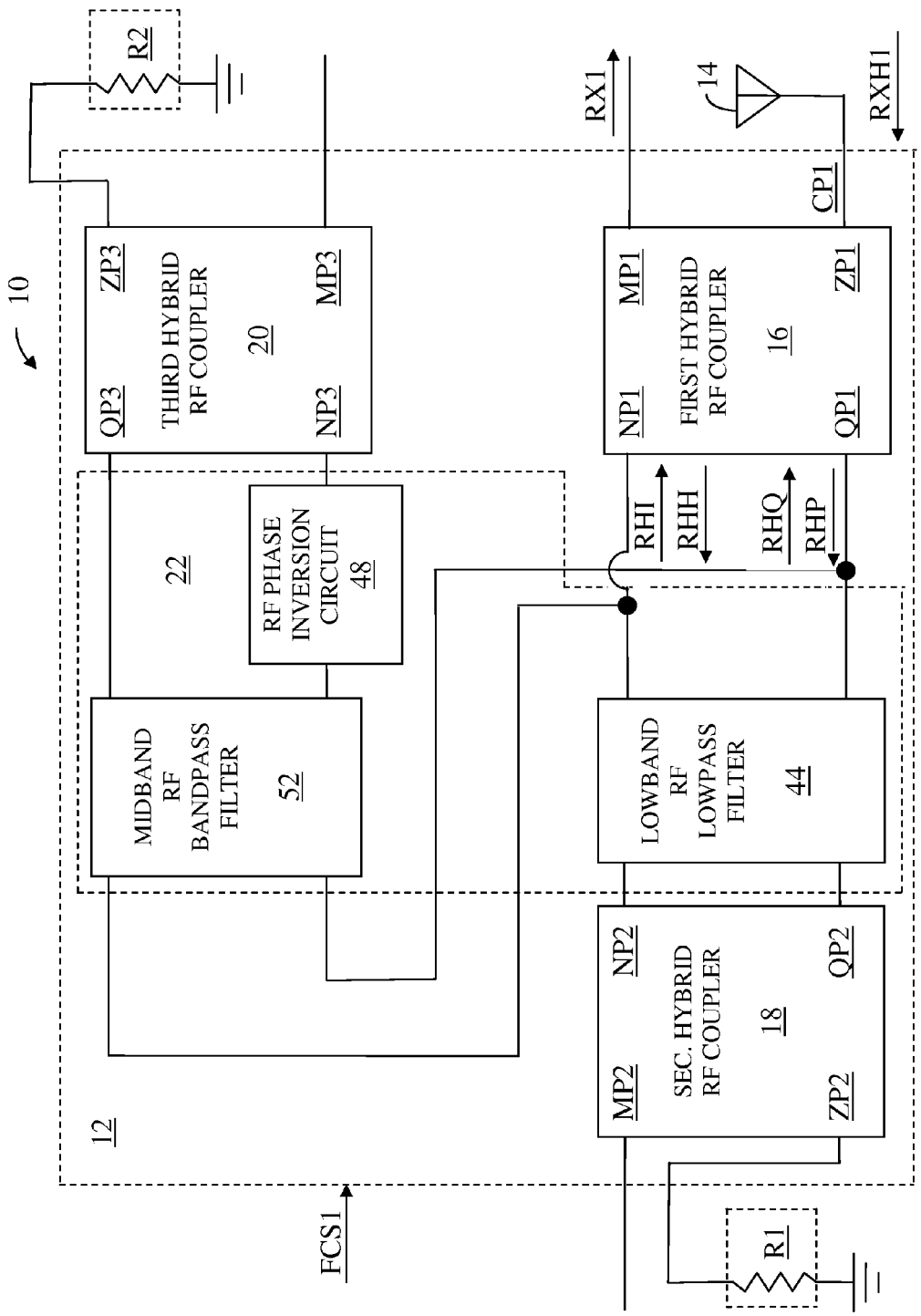
FIG. 9 shows details of the first RF triplexer illustrated in FIG. 1 according to a further embodiment of the first RF triplexer.

FIG. 9 shows details of the first RF triplexer 12 illustrated in FIG. 1 according to a further embodiment of the first RF triplexer 12. The first RF triplexer 12 illustrated in FIG. 9 is similar to the first RF triplexer 12 illustrated in FIG. 8, except in the first RF triplexer 12 illustrated in FIG. 9, the first hybrid RF coupler 16 receives the first highband RF receive signal RXH1 via the first RF antenna 14 to provide the first RF receive signal RX1.

The first hybrid RF coupler 16 receives, splits, and phase-shifts the first highband RF receive signal RXH1 to provide a highband quadrature-phase feeder RF receive signal RHP via the first quadrature-phase port QP1 and a highband in-phase feeder RF receive signal RHH via the first in-phase port NP1. In one embodiment of the highband quadrature-phase feeder RF receive signal RHP and the highband in-phase feeder RF receive signal RHH, the highband quadrature-phase feeder RF receive signal RHP is phase-shifted from the highband in-phase feeder RF receive signal RHH by about 90 degrees.

The lowband RF lowpass filter 44 and the midband RF bandpass filter 52 present about high impedances to the first hybrid RF coupler 16 at the carrier frequency of the first highband RF receive signal RXH1. As a result, the highband quadrature-phase feeder RF receive signal RHP and the highband in-phase feeder RF receive signal RHH are substantially reflected back to provide a highband quadrature-phase RF receive signal RHQ and a highband in-phase RF receive signal RHI, respectively, to the first quadrature-phase port QP1 and the first in-phase port NP1, respectively. The first hybrid RF coupler 16 receives, phase-shifts, and combines highband quadrature-phase RF receive signal RHQ and the highband in-phase RF receive signal RHI to provide the first RF receive signal RX1.

Since the lowband RF lowpass filter 44 and the midband RF bandpass filter 52 present about high impedances to the first hybrid RF coupler 16 at the carrier frequency of the first highband RF receive signal RXH1, the first main port MP1 is substantially isolated from the second main port MP2 and the first main port MP1 is substantially isolated from the third main port MP3 at the carrier frequency of the first highband RF receive signal RXH1.

Figure 10:
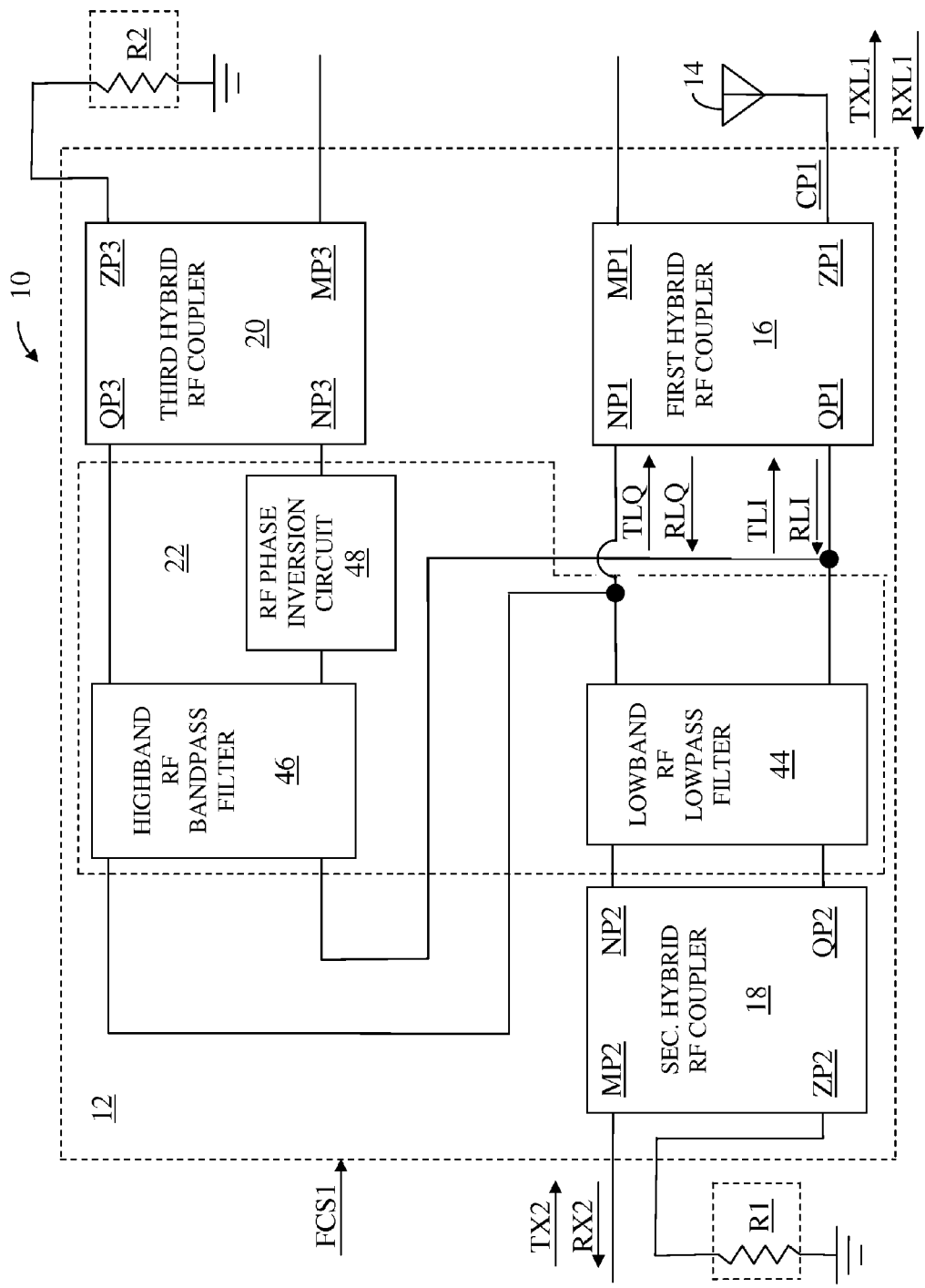
FIG. 10 shows details of the first RF triplexer illustrated in FIG. 1 according to one embodiment of the first RF triplexer.

FIG. 10 shows details of the first RF triplexer 12 illustrated in FIG. 1 according to one embodiment of the first RF triplexer 12. The first RF triplexer 12 illustrated in FIG. 10 is similar to the first RF triplexer 12 illustrated in FIG. 5, except in the first RF triplexer 12 illustrated in FIG. 10, the second hybrid RF coupler 18 transmits the first lowband RF transmit signal TXL1 via the first RF antenna 14 using the second RF transmit signal TX2. Additionally, the second hybrid RF coupler 18 receives the first lowband RF receive signal RXL1 via the first RF antenna 14 using the second RF receive signal RX2.

As such, the second hybrid RF coupler 18 receives, splits, and phase-shifts the second RF transmit signal TX2 to provide a lowband quadrature-phase RF transmit signal TLQ via the second in-phase port NP2 and the lowband RF lowpass filter 44; and to provide a lowband in-phase RF transmit signal TLI via the second quadrature-phase port QP2 and the lowband RF lowpass filter 44. In one embodiment of the lowband quadrature-phase RF transmit signal TLQ and the lowband in-phase RF transmit signal TLI, the lowband quadrature-phase RF transmit signal TLQ is phase-shifted from the lowband in-phase RF transmit signal TLI by about 90 degrees.

The lowband RF lowpass filter 44 provides about low impedances at the carrier frequency of the second RF transmit signal TX2 to allow forwarding of the lowband quadrature-phase RF transmit signal TLQ and the lowband in-phase RF transmit signal TLI. The first hybrid RF coupler 16 receives, phase-shifts, and combines the lowband quadrature-phase RF transmit signal TLQ and the lowband in-phase RF transmit signal TLI to provide the first lowband RF transmit signal TXL1.

Since the lowband RF lowpass filter 44 presents about high impedances at the carrier frequency of the first midband RF transmit signal TXM1 and at the carrier frequency of the first highband RF transmit signal TXH1, the second main port MP2 is substantially isolated from the first main port MP1 and the second main port MP2 is substantially isolated from the third main port MP3 at the carrier frequency of the first midband RF transmit signal TXM1 and at the carrier frequency of the first highband RF transmit signal TXH1.

The first hybrid RF coupler 16 receives, splits, and phase-shifts the first lowband RF receive signal RXL1 to provide a lowband in-phase RF receive signal RLI via the first quadrature-phase port QP1 and a lowband quadrature-phase RF receive signal RLQ via the first in-phase port NP1. In one embodiment of the lowband quadrature-phase RF receive signal RLQ and the lowband in-phase RF receive signal RLI, the lowband quadrature-phase RF receive signal RLQ is phase-shifted from the lowband in-phase RF receive signal RLI by about 90 degrees.

The second hybrid RF coupler 18 receives, phase-shifts, and combines the lowband quadrature-phase RF receive signal RLQ and the lowband in-phase RF receive signal RLI via the lowband RF lowpass filter 44 to provide the second RF receive signal RX2.

Since the lowband RF lowpass filter 44 presents about high impedances at the carrier frequency of the first midband RF receive signal RXM1 (FIG. 3) and at the carrier frequency of the first highband RF receive signal RXH1 (FIG. 3), the second main port MP2 is substantially isolated from the first main port MP1 and the second main port MP2 is substantially isolated from the third main port MP3 at the carrier frequency of the first midband RF receive signal RXM1 (FIG. 3) and at the carrier frequency of the first highband RF receive signal RXH1 (FIG. 3).

Figure 11:
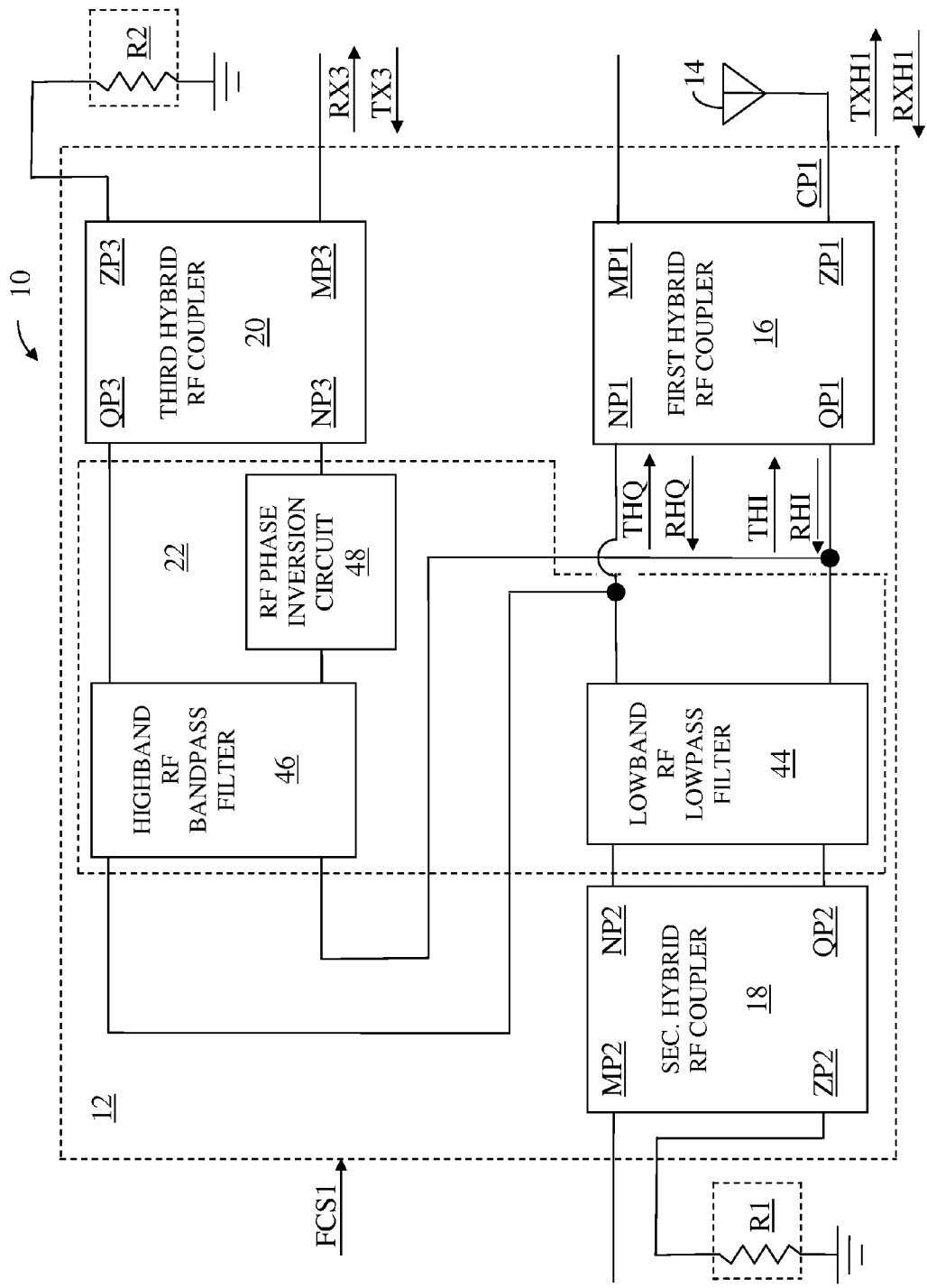
FIG. 11 shows details of the first RF triplexer illustrated in FIG. 1 according to an alternate embodiment of the first RF triplexer.

FIG. 11 shows details of the first RF triplexer 12 illustrated in FIG. 1 according to an alternate embodiment of the first RF triplexer 12. The first RF triplexer 12 illustrated in FIG. 11 is similar to the first RF triplexer 12 illustrated in FIG. 10, except in the first RF triplexer 12 illustrated in FIG. 11, the third hybrid RF coupler 20 transmits the first highband RF transmit signal TXH1 via the first RF antenna 14 using the third RF transmit signal TX3. Additionally, the third hybrid RF coupler 20 receives the first highband RF receive signal RXH1 via the first RF antenna 14 using the third RF receive signal RX3.

As such, the third hybrid RF coupler 20 receives, splits, and phase-shifts the third RF transmit signal TX3 to provide a highband quadrature-phase RF transmit signal THQ via the third quadrature-phase port QP3 and the highband RF bandpass filter 46; and to provide a highband in-phase RF transmit signal THI via the third in-phase port NP3, the RF phase inversion circuit 48, and the highband RF bandpass filter 46. In one embodiment of the highband quadrature-phase RF transmit signal THQ and the highband in-phase RF transmit signal THI, the highband quadrature-phase RF transmit signal THQ is phase-shifted from the highband in-phase RF transmit signal THI by about 90 degrees.

The highband RF bandpass filter 46 provides about low impedances at the carrier frequency of the third RF transmit signal TX3 to allow forwarding of the highband quadrature-phase RF transmit signal THQ and the highband in-phase RF transmit signal THI. The first hybrid RF coupler 16 receives, phase-shifts, and combines the highband quadrature-phase RF transmit signal THQ and the highband in-phase RF transmit signal THI to provide the first highband RF transmit signal TXH1.

Since the highband RF bandpass filter 46 presents about high impedances at the carrier frequency of the first midband RF transmit signal TXM1 (FIG. 5) and at the carrier frequency of the first lowband RF transmit signal TXL1 (FIG. 10), the third main port MP3 is substantially isolated from the first main port MP1 and the third main port MP3 is substantially isolated from the second main port MP2 at the carrier frequency of the first midband RF transmit signal TXM1 and at the carrier frequency of the first lowband RF transmit signal TXL1.

The first hybrid RF coupler 16 receives, splits, and phase-shifts the first highband RF receive signal RXH1 to provide a highband in-phase RF receive signal RHI via the first quadrature-phase port QP1 and a highband quadrature-phase RF receive signal RHQ via the first in-phase port NP1. In one embodiment of the highband quadrature-phase RF receive signal RHQ and the highband in-phase RF receive signal RHI, the highband quadrature-phase RF receive signal RHQ is phase-shifted from the highband in-phase RF receive signal RHI by about 90 degrees.

The third hybrid RF coupler 20 receives, phase-shifts, and combines the highband quadrature-phase RF receive signal RHQ and the highband in-phase RF receive signal RHI via the highband RF bandpass filter 46 and the RF phase inversion circuit 48 to provide the third RF receive signal RX3.

Since the highband RF bandpass filter 46 presents about high impedances at the carrier frequency of the first midband RF receive signal RXM1 (FIG. 3) and at the carrier frequency of the first lowband RF receive signal RXL1 (FIG. 3), the third main port MP3 is substantially isolated from the first main port MP1 and the second main port MP2.

Figure 12:
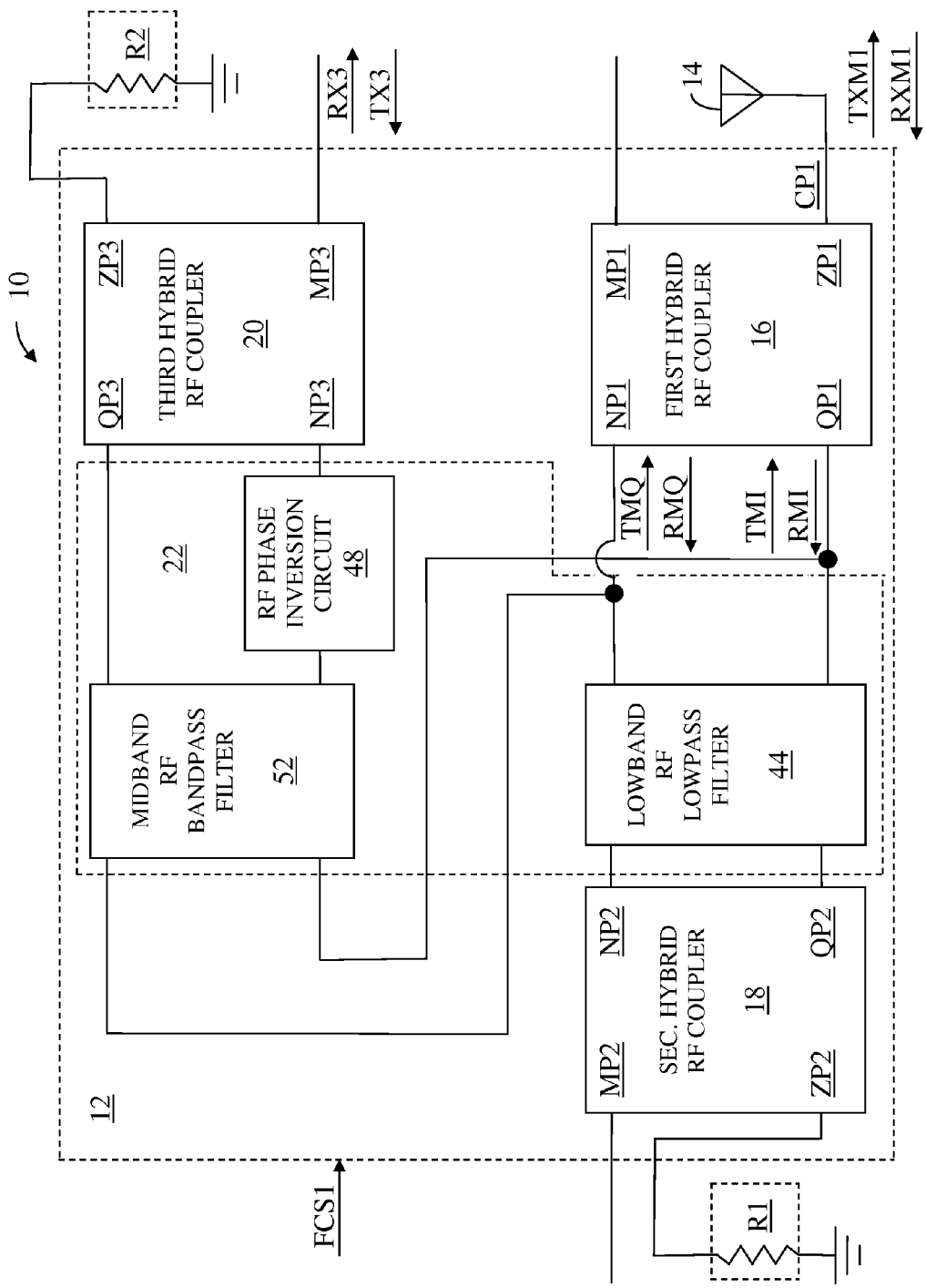
FIG. 12 shows details of the first RF triplexer illustrated in FIG. 1 according to another embodiment of the first RF triplexer.

FIG. 12 shows details of the first RF triplexer 12 illustrated in FIG. 1 according to another embodiment of the first RF triplexer 12. The first RF triplexer 12 illustrated in FIG. 12 is similar to the first RF triplexer 12 illustrated in FIG. 8, except in the first RF triplexer 12 illustrated in FIG. 12, the third hybrid RF coupler 20 transmits the first midband RF transmit signal TXM1 via the first RF antenna 14 using the third RF transmit signal TX3. Additionally, the third hybrid RF coupler 20 receives the first midband RF receive signal RXM1 via the first RF antenna 14 using the third RF receive signal RX3.

As such, the third hybrid RF coupler 20 receives, splits, and phase-shifts the third RF transmit signal TX3 to provide a midband quadrature-phase RF transmit signal TMQ via the third quadrature-phase port QP3 and the midband RF bandpass filter 52; and to provide a midband in-phase RF transmit signal TMI via the third in-phase port NP3, the RF phase inversion circuit 48, and the midband RF bandpass filter 52. In one embodiment of the midband quadrature-phase RF transmit signal TMQ and the midband in-phase RF transmit signal TMI, the midband quadrature-phase RF transmit signal TMQ is phase-shifted from the midband in-phase RF transmit signal TMI by about 90 degrees.

The midband RF bandpass filter 52 provides about low impedances at the carrier frequency of the third RF transmit signal TX3 to allow forwarding of the midband quadrature-phase RF transmit signal TMQ and the midband in-phase RF transmit signal TMI. The first hybrid RF coupler 16 receives, phase-shifts, and combines the midband quadrature-phase RF transmit signal TMQ and the midband in-phase RF transmit signal TMI to provide the first midband RF transmit signal TXM1.

Since the midband RF bandpass filter 52 presents about high impedances at the carrier frequency of the first highband RF transmit signal TXH1 (FIG. 11) and at the carrier frequency of the first lowband RF transmit signal TXL1 (FIG. 10), the third main port MP3 is substantially isolated from the first main port MP1 and the third main port MP3 is substantially isolated from the second main port MP2 at the carrier frequency of the first highband RF transmit signal TXH1 and at the carrier frequency of the first lowband RF transmit signal TXL1.

The first hybrid RF coupler 16 receives, splits, and phase-shifts the first midband RF receive signal RXM1 to provide a midband in-phase RF receive signal RMI via the first quadrature-phase port QP1 and a midband quadrature-phase RF receive signal RMQ via the first in-phase port NP1. In one embodiment of the midband quadrature-phase RF receive signal RMQ and the midband in-phase RF receive signal RMI, the midband quadrature-phase RF receive signal RMQ is phase-shifted from the midband in-phase RF receive signal RMI by about 90 degrees.

The third hybrid RF coupler 20 receives, phase-shifts, and combines the midband quadrature-phase RF receive signal RMQ and the midband in-phase RF receive signal RMI via the midband RF bandpass filter 52 and the RF phase inversion circuit 48 to provide the third RF receive signal RX3.

Since the midband RF bandpass filter 52 presents about high impedances at the carrier frequency of the first highband RF receive signal RXH1 (FIG. 3) and at the carrier frequency of the first lowband RF receive signal RXL1 (FIG. 3), the third main port MP3 is substantially isolated from the first main port MP1 and the second main port MP2.

Figure 13:
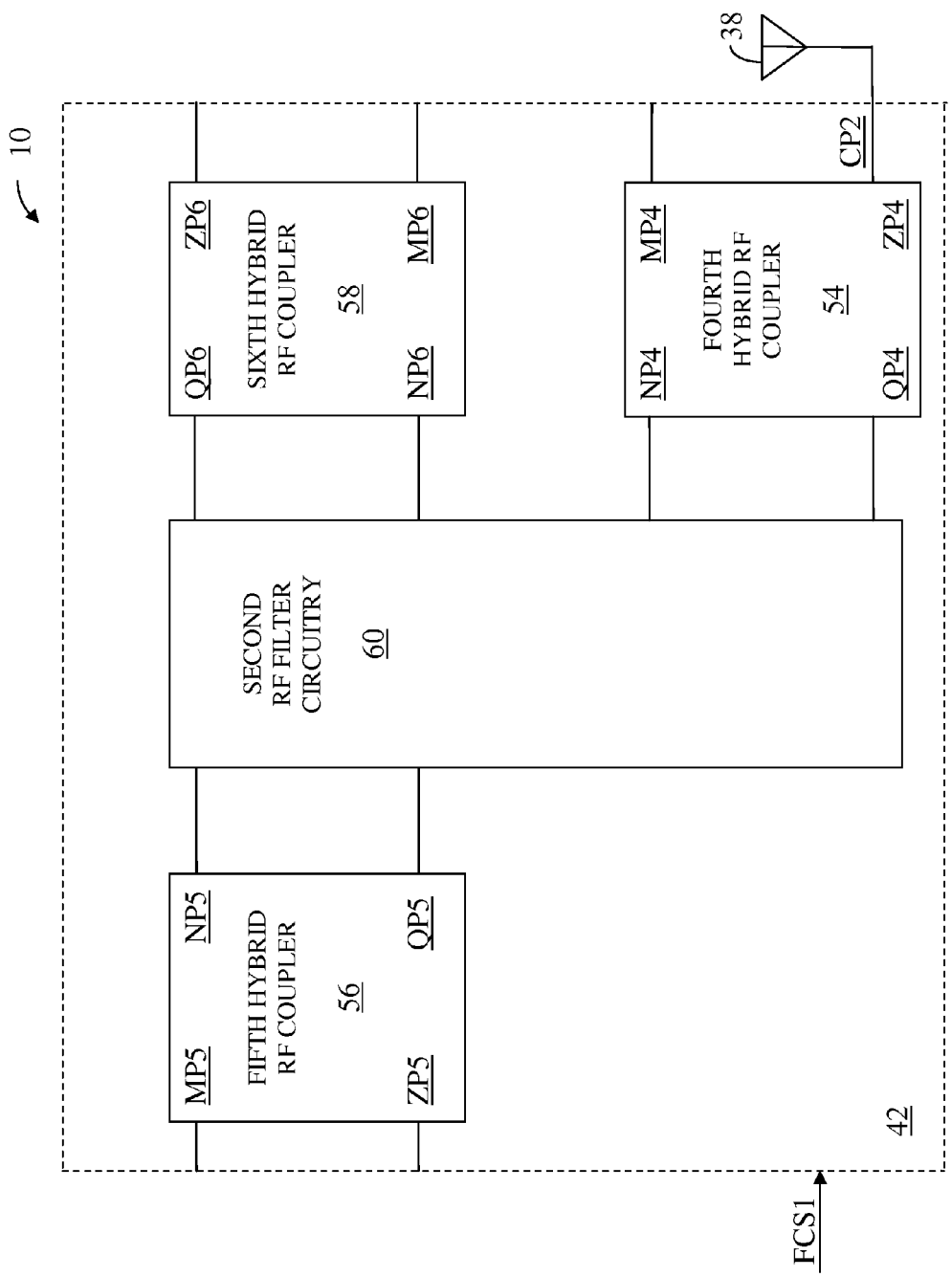
FIG. 13 shows the RF communications circuitry according to one embodiment of the RF communications circuitry.

FIG. 13 shows the RF communications circuitry 10 according to one embodiment of the RF communications circuitry 10. The RF communications circuitry 10 includes the second RF triplexer 42 and the second RF antenna 38. The second RF triplexer 42 includes a fourth hybrid RF coupler 54, a fifth hybrid RF coupler 56, a sixth hybrid RF coupler 58, second RF filter circuitry 60, and the second common port CP2.

In one embodiment of the second RF triplexer 42, the second RF triplexer 42 receives the first function configuration signal FCS1, such that the second RF filter circuitry 60 is second tunable RF filter circuitry. In this regard, filtering characteristics of the second RF filter circuitry 60 are based on the first function configuration signal FCS1. In an alternate embodiment of the RF communications circuitry 10, the first function configuration signal FCS1 is omitted.

In general, the second RF filter circuitry 60 is coupled between the fourth hybrid RF coupler 54, the fifth hybrid RF coupler 56, and the sixth hybrid RF coupler 58. The second RF antenna 38 is coupled to the fourth hybrid RF coupler 54.

The fourth hybrid RF coupler 54 has the fourth main port MP4, a fourth in-phase port NP4, a fourth quadrature-phase port QP4, and a fourth isolation port ZP4, which functions as the second common port CP2. In this regard, the fourth isolation port ZP4 is coupled to the second RF antenna 38. The fifth hybrid RF coupler 56 has the fifth main port MP5, a fifth in-phase port NP5, a fifth quadrature-phase port QP5, and a fifth isolation port ZP5. The sixth hybrid RF coupler 58 has the sixth main port MP3, a sixth in-phase port NP6, a sixth quadrature-phase port QP6, and a sixth isolation port ZP6. As such, the second RF filter circuitry 60 is coupled to the fourth in-phase port NP4, the fourth quadrature-phase port QP4, the fifth in-phase port NP5, the fifth quadrature-phase port QP5, the sixth in-phase port NP6, and the sixth quadrature-phase port QP6.

In one embodiment of the second RF triplexer 42, the fourth hybrid RF coupler 54 receives the second midband RF receive signal RXM2 (FIG. 4) via the second RF antenna 38, the fifth hybrid RF coupler 56 receives the second lowband RF receive signal RXL2 (FIG. 4) via the second RF antenna 38, and the sixth hybrid RF coupler 58 receives the second highband RF receive signal RXH2 (FIG. 4) via the second RF antenna 38.

In an alternate embodiment of the second RF triplexer 42, the fourth hybrid RF coupler 54 receives the second highband RF receive signal RXH2 (FIG. 4) via the second RF antenna 38, the fifth hybrid RF coupler 56 receives the second lowband RF receive signal RXL2 (FIG. 4) via the second RF antenna 38, and the sixth hybrid RF coupler 58 receives the second midband RF receive signal RXM2 (FIG. 4) via the second RF antenna 38.

In one embodiment of the first RF triplexer 12 (FIG. 1), the first RF triplexer 12 (FIG. 1) includes the first hybrid RF coupler 16 (FIG. 9), the second hybrid RF coupler 18 (FIG. 10), and the third hybrid RF coupler 20 (FIG. 11). The first hybrid RF coupler 16 (FIG. 9) receives the first midband RF receive signal RXM1 (FIG. 6) via the first RF antenna 14 (FIG. 6). The second hybrid RF coupler 18 (FIG. 10) receives the first lowband RF receive signal RXL1 (FIG. 10) via the first RF antenna 14 (FIG. 10). The third hybrid RF coupler 20 (FIG. 11) receives the first highband RF receive signal RXH1 (FIG. 11) via the first RF antenna 14 (FIG. 11).

In one embodiment of the first RF triplexer 12 (FIG. 1), the first hybrid RF coupler 16 (FIG. 9), the second hybrid RF coupler 18 (FIG. 10), and the third hybrid RF coupler 20 (FIG. 11) receive the first midband RF receive signal RXM1 (FIG. 6), the first lowband RF receive signal RXL1 (FIG. 10), and the first highband RF receive signal RXH1 (FIG. 11) simultaneously.

In one embodiment of the first RF triplexer 12 (FIG. 1), the first RF triplexer 12 (FIG. 1) includes the first hybrid RF coupler 16 (FIG. 9), the second hybrid RF coupler 18 (FIG. 10), and the third hybrid RF coupler 20 (FIG. 12). The first hybrid RF coupler 16 (FIG. 9) receives the first highband RF receive signal RXH1 (FIG. 9) via the first RF antenna 14 (FIG. 9). The second hybrid RF coupler 18 (FIG. 10) receives the first lowband RF receive signal RXL1 (FIG. 10) via the first RF antenna 14 (FIG. 10). The third hybrid RF coupler 20 (FIG. 12) receives the first midband RF receive signal RXM1 (FIG. 12) via the first RF antenna 14 (FIG. 12).

In one embodiment of the first RF triplexer 12 (FIG. 1), the first hybrid RF coupler 16 (FIG. 9), the second hybrid RF coupler 18 (FIG. 10), and the third hybrid RF coupler 20 (FIG. 12) receive the first highband RF receive signal RXH1 (FIG. 9), the first lowband RF receive signal RXL1 (FIG. 10), and the first midband RF receive signal RXM1 (FIG. 12) simultaneously.

In one embodiment of the first RF triplexer 12 (FIG. 1), the first RF triplexer 12 (FIG. 1) includes the first hybrid RF coupler 16 (FIG. 5), the second hybrid RF coupler 18 (FIG. 10), and the third hybrid RF coupler 20 (FIG. 11). The first hybrid RF coupler 16 (FIG. 5) transmits the first midband RF transmit signal TXM1 (FIG. 5) via the first RF antenna 14 (FIG. 5). The second hybrid RF coupler 18 (FIG. 10) transmits the first lowband RF transmit signal TXL1 (FIG. 10) via the first RF antenna 14 (FIG. 10). The third hybrid RF coupler 20 (FIG. 11) transmits the first highband RF transmit signal TXH1 (FIG. 11) via the first RF antenna 14 (FIG. 11).

In one embodiment of the first RF triplexer 12 (FIG. 1), the first RF triplexer 12 (FIG. 1) includes the first hybrid RF coupler 16 (FIG. 8), the second hybrid RF coupler 18 (FIG. 10), and the third hybrid RF coupler 20 (FIG. 12). The first hybrid RF coupler 16 (FIG. 8) transmits the first highband RF transmit signal TXH1 (FIG. 8) via the first RF antenna 14 (FIG. 8). The second hybrid RF coupler 18 (FIG. 10) transmits the first lowband RF transmit signal TXL1 (FIG. 10) via the first RF antenna 14 (FIG. 10). The third hybrid RF coupler 20 (FIG. 12) transmits the first midband RF transmit signal TXM1 (FIG. 12) via the first RF antenna 14 (FIG. 12).

In one embodiment of the first RF triplexer 12 (FIG. 1), the first hybrid RF coupler 16 (FIG. 5), the second hybrid RF coupler 18 (FIG. 10), and the third hybrid RF coupler 20 (FIG. 11) transmit at least two of the first midband RF transmit signal TXM1 (FIG. 5), the first lowband RF transmit signal TXL1 (FIG. 10), and the first highband RF transmit signal TXH1 (FIG. 11) simultaneously.

Figure 14:
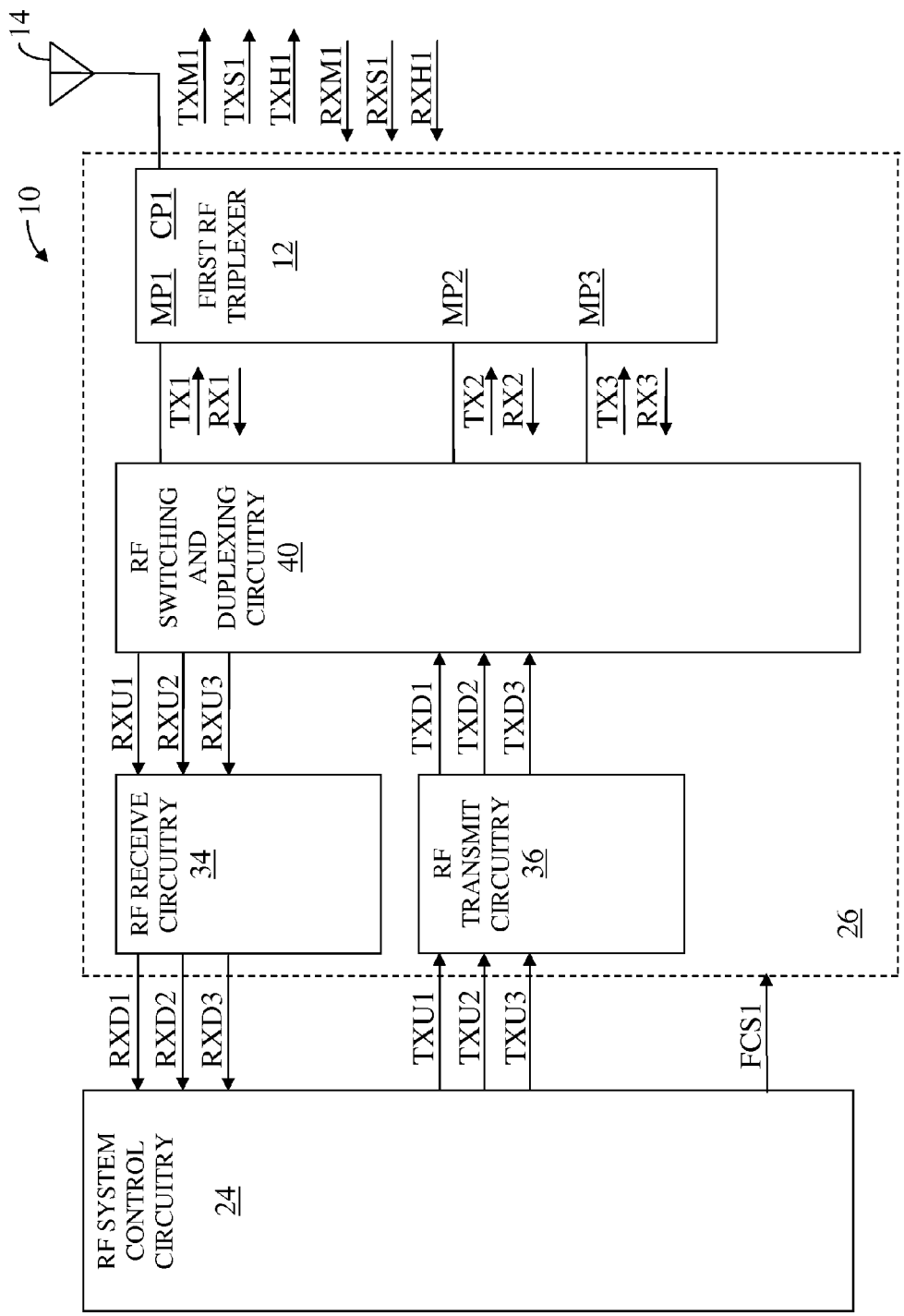
FIG. 14 shows the RF communications circuitry according to an alternate embodiment of the RF communications circuitry.

FIG. 14 shows the RF communications circuitry 10 according to an alternate embodiment of the RF communications circuitry 10. The RF communications circuitry 10 illustrated in FIG. 14 is similar to the RF communications circuitry 10 illustrated in FIG. 4, except in the RF communications circuitry 10 illustrated in FIG. 14, the second RF antenna 38, the second RF triplexer 42, the fourth RF receive signal RX4, the fourth RF transmit signal TX4, the fifth RF receive signal RX5, the fifth RF transmit signal TX5, the sixth RF receive signal RX6, the sixth RF transmit signal TX6, the fourth downstream RF receive signal RXD4, the fifth downstream RF receive signal RXD5, the sixth downstream RF receive signal RXD6, the fourth upstream RF transmit signal TXU4, the fifth upstream RF transmit signal TXU5, the sixth upstream RF transmit signal TXU6, the fourth downstream RF transmit signal TXD4, the fifth downstream RF transmit signal TXD5, the sixth downstream RF transmit signal TXD6, the fourth upstream RF receive signal RXU4, the fifth upstream RF receive signal RXU5, the sixth upstream RF receive signal RXU6, the first lowband RF transmit signal TXL1, and the first lowband RF receive signal RXL1 are omitted.

The first RF triplexer 12 receives and forwards the first RF transmit signal TX1 via the first main port MP1 to the first common port CP1 to provide a first industrial, scientific, and medical (ISM)-band RF transmit signal TXS1. As such, the first hybrid RF coupler 16 (FIG. 1) transmits the first ISM-band RF transmit signal TXS1 via the first RF antenna 14.

The first RF triplexer 12 receives and forwards the second RF transmit signal TX2 via the second main port MP2 to the first common port CP1 to provide the first midband RF transmit signal TXM1. As such, the second hybrid RF coupler 18 (FIG. 1) transmits the first midband RF transmit signal TXM1 via the first RF antenna 14.

The first RF triplexer 12 receives and forwards the third RF transmit signal TX3 via the third main port MP3 to the first common port CP1 to provide the first highband RF transmit signal TXH1. As such, the third hybrid RF coupler 20 (FIG. 1) transmits the first highband RF transmit signal TXH1 via the first RF antenna 14.

The first RF triplexer 12 receives and forwards a first ISM-band RF receive signal RXS1 via the first RF antenna 14 to the first main port MP1 to provide the first RF receive signal RX1. As such, the first hybrid RF coupler 16 (FIG. 1) receives the first ISM-band RF receive signal RXS1 via the first RF antenna 14.

The first RF triplexer 12 receives and forwards the first midband RF receive signal RXM1 via the first RF antenna 14 to the second main port MP2 to provide the second RF receive signal RX2. As such, the second hybrid RF coupler 18 (FIG. 1) receives the first midband RF receive signal RXM1 via the first RF antenna 14.

The first RF triplexer 12 receives and forwards the first highband RF receive signal RXH1 via the first RF antenna 14 to the third main port MP3 to provide the third RF receive signal RX3. As such, the third hybrid RF coupler 20 (FIG. 1) receives the first highband RF receive signal RXH1 via the first RF antenna 14.

By definition, a carrier frequency of the first ISM-band RF transmit signal TXS1 is greater than the carrier frequency of the first midband RF transmit signal TXM1. By definition, the carrier frequency of the first highband RF transmit signal TXH1 is greater than the carrier frequency of the first ISM-band RF transmit signal TXS1. As such, by definition, the carrier frequency of the first highband RF transmit signal TXH1 is greater than the carrier frequency of the first ISM-band RF transmit signal TXS1.

By definition, a carrier frequency of the first ISM-band RF receive signal RXS1 is greater than the carrier frequency of the first midband RF receive signal RXM1. By definition, the carrier frequency of the first highband RF receive signal RXH1 is greater than the carrier frequency of the first ISM-band RF receive signal RXS1. As such, by definition, the carrier frequency of the first highband RF receive signal RXH1 is greater than the carrier frequency of the first midband RF receive signal RXM1.

In one embodiment of the first midband RF receive signal RXM1, the carrier frequency of the first midband RF receive signal RXM1 is greater than about 1700 megahertz and less than about 2300 megahertz. In one embodiment of the first midband RF transmit signal TXM1, the carrier frequency of the first midband RF transmit signal TXM1 is greater than about 1700 megahertz and less than about 2300 megahertz.

In one embodiment of the first ISM-band RF receive signal RXS1, the carrier frequency of the first ISM-band RF receive signal RXS1 is greater than about 2400 megahertz and less than about 2490 megahertz. In one embodiment of the first ISM-band RF transmit signal TXS1, the carrier frequency of the first ISM-band RF transmit signal TXS1 is greater than about 2400 megahertz and less than about 2490 megahertz.

In one embodiment of the first highband RF receive signal RXH1, the carrier frequency of the first highband RF receive signal RXH1 is greater than about 2500 megahertz and less than about 2700 megahertz. In one embodiment of the first highband RF transmit signal TXH1, the carrier frequency of the first highband RF transmit signal TXH1 is greater than about 2500 megahertz and less than about 2700 megahertz.

In one embodiment of the first RF triplexer 12, the first RF triplexer 12 establishes TXULCA by providing the first midband RF transmit signal TXM1 and the first highband RF transmit signal TXH1 simultaneously. As such, in one embodiment of the first RF triplexer 12, the first midband RF transmit signal TXM1 and the first highband RF transmit signal TXH1 are TXULCA signals. In one embodiment of the first RF triplexer 12, the first RF triplexer 12 provides the first midband RF transmit signal TXM1, the first ISM-band RF transmit signal TXS1, and the first highband RF transmit signal TXH1 simultaneously.

In one embodiment of the first RF triplexer 12, the first RF triplexer 12 establishes RXDLCA by receiving the first midband RF receive signal RXM1 and the first highband RF receive signal RXH1 simultaneously. As such, in one embodiment of the first RF triplexer 12, the first midband RF receive signal RXM1 and the first highband RF receive signal RXH1 are RXDLCA signals.

Figure 15:
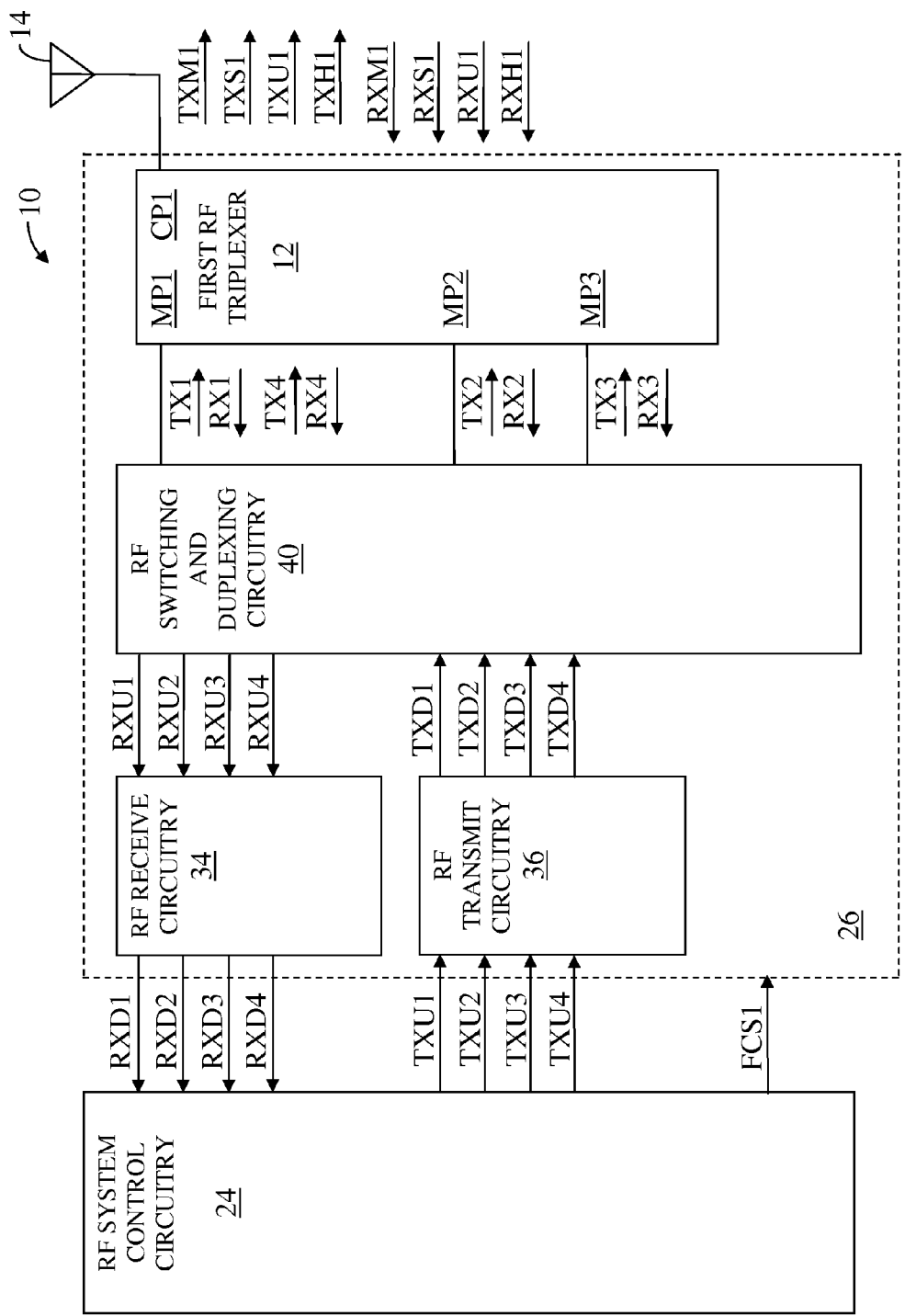
FIG. 15 shows the RF communications circuitry according to an additional embodiment of the RF communications circuitry.

FIG. 15 shows the RF communications circuitry 10 according to an additional embodiment of the RF communications circuitry 10. The RF communications circuitry 10 illustrated in FIG. 15 is similar to the RF communications circuitry 10 illustrated in FIG. 4, except in the RF communications circuitry 10 illustrated in FIG. 15, the second RF antenna 38, the second RF triplexer 42, the fifth RF receive signal RX5, the fifth RF transmit signal TX5, the sixth RF receive signal RX6, the sixth RF transmit signal TX6, the fifth downstream RF receive signal RXD5, the sixth downstream RF receive signal RXD6, the fifth upstream RF transmit signal TXU5, the sixth upstream RF transmit signal TXU6, the fifth downstream RF transmit signal TXD5, the sixth downstream RF transmit signal TXD6, the fifth upstream RF receive signal RXU5, the sixth upstream RF receive signal RXU6, the first lowband RF transmit signal TXL1, and the first lowband RF receive signal RXL1 are omitted.

Additionally, the RF communications circuitry 10 illustrated in FIG. 15 is similar to the RF communications circuitry 10 illustrated in FIG. 14, except in the RF communications circuitry 10 illustrated in FIG. 15, the first RF triplexer 12 receives and forwards the fourth RF transmit signal TX4 via the first main port MP1 to the first common port CP1 to provide a first ultra-highband RF transmit signal TXU1. As such, the first hybrid RF coupler 16 (FIG. 1) transmits the first ultra-highband RF transmit signal TXU1 via the first RF antenna 14. Further, the first RF triplexer 12 receives and forwards a first ultra-highband RF receive signal RXU1 via the first RF antenna 14 to the first main port MP1 to provide the fourth RF receive signal RX4. As such, the first hybrid RF coupler 16 (FIG. 1) receives the first ultra-highband RF receive signal RXU1 via the first RF antenna 14.

By definition, a carrier frequency of the first ultra-highband RF transmit signal TXU1 is greater than the carrier frequency of the first highband RF transmit signal TXH1. By definition, a carrier frequency of the first ultra-highband RF receive signal RXU1 is greater than the carrier frequency of the first highband RF receive signal RXH1.

In one embodiment of the first ultra-highband RF receive signal RXU1, the carrier frequency of the first ultra-highband RF receive signal RXU1 is greater than about 3400 megahertz and less than about 3600 megahertz. In one embodiment of the first highband RF transmit signal TXH1, the carrier frequency of the first highband RF transmit signal TXH1 is greater than about 3400 megahertz and less than about 3600 megahertz.

In one embodiment of the first RF triplexer 12, the first RF triplexer 12 establishes TXULCA by providing the at least two of the first midband RF transmit signal TXM1, the first highband RF transmit signal TXH1, and the first ultra-highband RF transmit signal TXU1 simultaneously. As such, the first midband RF transmit signal TXM1, the first highband RF transmit signal TXH1, and the first ultra-highband RF transmit signal TXU1 are TXULCA signals.

In one embodiment of the first RF triplexer 12, the first RF triplexer 12 establishes RXDLCA by receiving at least two of the first midband RF receive signal RXM1, the first highband RF receive signal RXH1, and the first ultra-highband RF receive signal RXU1 simultaneously. As such, the at least two of the first midband RF receive signal RXM1, the first highband RF receive signal RXH1, and the first ultra-highband RF receive signal RXU1 are RXDLCA signals. In one embodiment of the first RF triplexer 12, the first hybrid RF coupler 16, the second hybrid RF coupler 18, and the third hybrid RF coupler 20 receive the first midband RF receive signal RXM1, the first highband RF receive signal RXH1, first ultra-highband RF receive signal RXU1, and the first ISM-band RF receive signal RXS1 simultaneously.

In one embodiment of the first RF triplexer 12, the first hybrid RF coupler 16, the second hybrid RF coupler 18, and the third hybrid RF coupler 20 transmit the first midband RF transmit signal TXM1, the first highband RF transmit signal TXH1, first ultra-highband RF transmit signal TXU1, and the first ISM-band RF transmit signal TXS1 simultaneously. In one embodiment of the first RF triplexer 12, the first ISM-band RF transmit signal TXS1 and the first ISM-band RF receive signal RXS1 are omitted.

In an alternate embodiment of the first RF triplexer 12, the first midband RF transmit signal TXM1 replaces the first ISM-band RF transmit signal TXS1 and the first ISM-band RF transmit signal TXS1 replaces the first midband RF transmit signal TXM1. Additionally, the first midband RF receive signal RXM1 replaces the first ISM-band RF receive signal RXS1 and the first ISM-band RF receive signal RXS1 replaces the first midband RF receive signal RXM1.

In this regard, the first hybrid RF coupler 16 (FIG. 1) receives the first midband RF receive signal RXM1 via the first RF antenna 14, the second hybrid RF coupler 18 (FIG. 1) receives the first ISM-band RF receive signal RXS1 via the first RF antenna 14, the first hybrid RF coupler 16 (FIG. 1) transmits the first midband RF transmit signal TXM1 via the first RF antenna 14, and the second hybrid RF coupler 18 (FIG. 1) transmits the first ISM-band RF transmit signal TXS1 via the first RF antenna 14.

In an additional embodiment of the first RF triplexer 12, the first ISM-band RF transmit signal TXS1 replaces the first highband RF transmit signal TXH1 and the first highband RF transmit signal TXH1 replaces the first ISM-band RF transmit signal TXS1. Additionally, the first ISM-band RF receive signal RXS1 replaces the first highband RF receive signal RXH1 and the first highband RF receive signal RXH1 replaces the first ISM-band RF receive signal RXS1.

In this regard, the first hybrid RF coupler 16 (FIG. 1) receives the first highband RF receive signal RXH1 via the first RF antenna 14, the third hybrid RF coupler 20 (FIG. 1) receives the first ISM-band RF receive signal RXS1 via the first RF antenna 14, the first hybrid RF coupler 16 (FIG. 1) transmits the first highband RF transmit signal TXH1 via the first RF antenna 14, and the third hybrid RF coupler 20 (FIG. 1) transmits the first ISM-band RF transmit signal TXS1 via the first RF antenna 14.

With regard to both FIG. 14 and FIG. 15, in general, in certain embodiments of the first RF triplexer 12, the first RF triplexer 12 establishes a first signal path between the first common port CP1 and the first main port MP1, a second signal path between the first common port CP1 and the second main port MP2, a third signal path between the first common port CP1 and the third main port MP3, or any combination thereof.

In this regard, in general, in a first exemplary embodiment of the first RF triplexer 12, the first RF triplexer 12 substantially passes at least a first RF signal between the first common port CP1 and the first main port MP1. In a first embodiment of the at least the first RF signal, a carrier frequency of each of the at least the first RF signal is between about 1700 megahertz and about 2300 megahertz, such that the first RF signal is a midband RF signal. In a second embodiment of the at least the first RF signal, the carrier frequency of each of the at least the first RF signal is between about 2400 megahertz and about 2490 megahertz, such that the first RF signal is an ISM-band RF signal. In a third embodiment of the at least the first RF signal, the carrier frequency of each of the at least the first RF signal is between about 2500 megahertz and about 2700 megahertz, such that the first RF signal is a highband RF signal. In a fourth embodiment of the at least the first RF signal, the carrier frequency of each of the at least the first RF signal is between about 3400 megahertz and about 3600 megahertz, such that the first RF signal is an ultra-highband RF signal.

In general, in a second exemplary embodiment of the first RF triplexer 12, the first RF triplexer 12 substantially passes at least a second RF signal between the first common port CP1 and the second main port MP2. In a first embodiment of the at least the second RF signal, a carrier frequency of each of the at least the second RF signal is between about 1700 megahertz and about 2300 megahertz, such that the second RF signal is a midband RF signal. In a second embodiment of the at least the second RF signal, the carrier frequency of each of the at least the second RF signal is between about 2400 megahertz and about 2490 megahertz, such that the second RF signal is an ISM-band RF signal. In a third embodiment of the at least the second RF signal, the carrier frequency of each of the at least the second RF signal is between about 2500 megahertz and about 2700 megahertz, such that the second RF signal is a highband RF signal. In a fourth embodiment of the at least the second RF signal, the carrier frequency of each of the at least the second RF signal is between about 3400 megahertz and about 3600 megahertz, such that the second RF signal is an ultra-highband RF signal. In a fifth embodiment of the at least the second RF signal, the carrier frequency of each of the at least the second RF signal is between about 2305 megahertz and about 2360 megahertz, such that the second RF signal is a Band 30 RF signal.

In general, in a third exemplary embodiment of the first RF triplexer 12, the first RF triplexer 12 substantially passes at least a third RF signal between the first common port CP1 and the third main port MP3. In a first embodiment of the at least the third RF signal, a carrier frequency of each of the at least the third RF signal is between about 1700 megahertz and about 2300 megahertz, such that the third RF signal is a midband RF signal. In a second embodiment of the at least the third RF signal, the carrier frequency of each of the at least the third RF signal is between about 2400 megahertz and about 2490 megahertz, such that the third RF signal is an ISM-band RF signal. In a third embodiment of the at least the third RF signal, the carrier frequency of each of the at least the third RF signal is between about 2500 megahertz and about 2700 megahertz, such that the third RF signal is a highband RF signal. In a fourth embodiment of the at least the third RF signal, the carrier frequency of each of the at least the third RF signal is between about 3400 megahertz and about 3600 megahertz, such that the third RF signal is an ultra-highband RF signal.

In a fourth exemplary embodiment of the first RF triplexer 12, the first RF triplexer 12 substantially passes at least a fourth RF signal between the first common port CP1 and the first main port MP1, such that the at least the fourth RF signal are in different communications bands than the at least the first RF signal. In a first embodiment of the at least the fourth RF signal, a carrier frequency of each of the at least the fourth RF signal is between about 1700 megahertz and about 2300 megahertz, such that the fourth RF signal is a midband RF signal. In a second embodiment of the at least the fourth RF signal, the carrier frequency of each of the at least the fourth RF signal is between about 2400 megahertz and about 2490 megahertz, such that the fourth RF signal is an ISM-band RF signal. In a third embodiment of the at least the fourth RF signal, the carrier frequency of each of the at least the fourth RF signal is between about 2500 megahertz and about 2700 megahertz, such that the fourth RF signal is a highband RF signal. In a fourth embodiment of the at least the fourth RF signal, the carrier frequency of each of the at least the fourth RF signal is between about 3400 megahertz and about 3600 megahertz, such that the fourth RF signal is an ultra-highband RF signal.

In one embodiment of the first RF triplexer 12, any, all, or portions of the first exemplary embodiment of the first RF triplexer 12, the second exemplary embodiment of the first RF triplexer 12, the third exemplary embodiment of the first RF triplexer 12, and the fourth exemplary embodiment of the first RF triplexer 12 may be combined to form new embodiments of the first RF triplexer 12.

Figure 16:
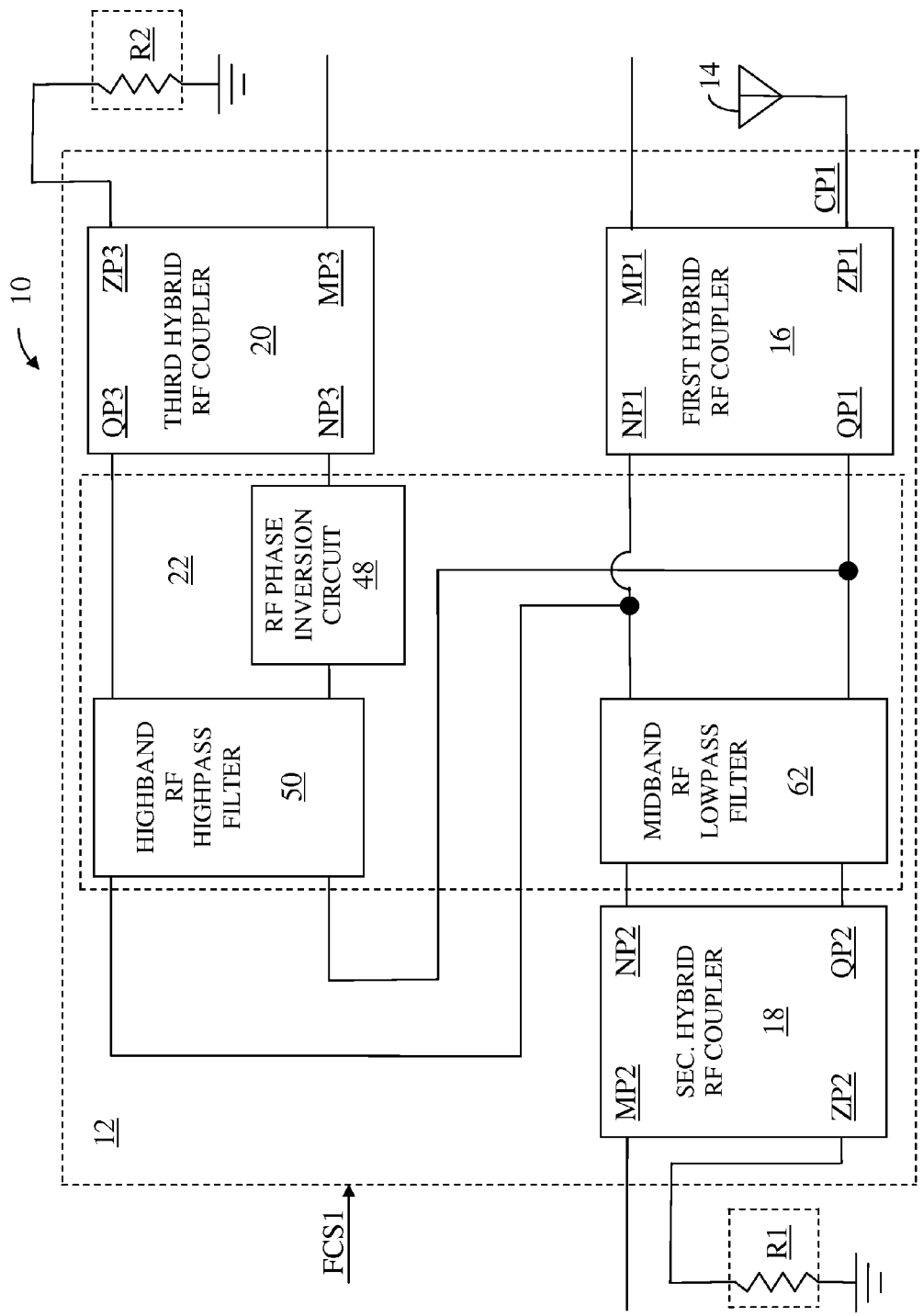
FIG. 16 shows details of the first RF triplexer illustrated in FIG. 14 according to one embodiment of the first RF triplexer.

FIG. 16 shows details of the first RF triplexer 12 illustrated in FIG. 14 according to one embodiment of the first RF triplexer 12. The first RF triplexer 12 illustrated in FIG. 16 is similar to the first RF triplexer 12 illustrated in FIG. 5, except in the first RF triplexer 12 illustrated in FIG. 16, the highband RF bandpass filter 46 is replaced with the highband RF highpass filter 50 and the lowband RF lowpass filter 44 is replaced with a midband RF lowpass filter 62.

As such, the midband RF lowpass filter 62 is coupled between the second hybrid RF coupler 18 and the first hybrid RF coupler 16. In one embodiment of the midband RF lowpass filter 62, the midband RF lowpass filter 62 is a tunable RF lowpass filter, such that a break frequency of the midband RF lowpass filter 62 is tunable based on the first function configuration signal FCS1.

The RF phase inversion circuit 48 and the highband RF highpass filter 50 are coupled in series between the third hybrid RF coupler 20 and the first hybrid RF coupler 16. In one embodiment of the highband RF highpass filter 50, the highband RF highpass filter 50 is a tunable RF highpass filter, such that a break frequency of the highband RF highpass filter 50 is tunable based on the first function configuration signal FCS1. The first RF triplexer 12 illustrated in FIG. 16 may process the first ISM-band RF transmit signal TXS1 and the first ISM-band RF receive signal RXS1 similarly to the first midband RF transmit signal TXM1 and the first midband RF receive signal RXM1 illustrated in FIGS. 5 and 6, respectively.

The first RF triplexer 12 illustrated in FIG. 16 may process the first highband RF transmit signal TXH1 and the first highband RF receive signal RXH1 similarly to the first highband RF transmit signal TXH1 and the first highband RF receive signal RXH1 illustrated in FIG. 11. The first RF triplexer 12 illustrated in FIG. 16 may process the first midband RF transmit signal TXM1 and the first midband RF receive signal RXM1 similarly to the first lowband RF transmit signal TXL1 and the first lowband RF receive signal RXL1 illustrated in FIG. 10.

Figure 17:
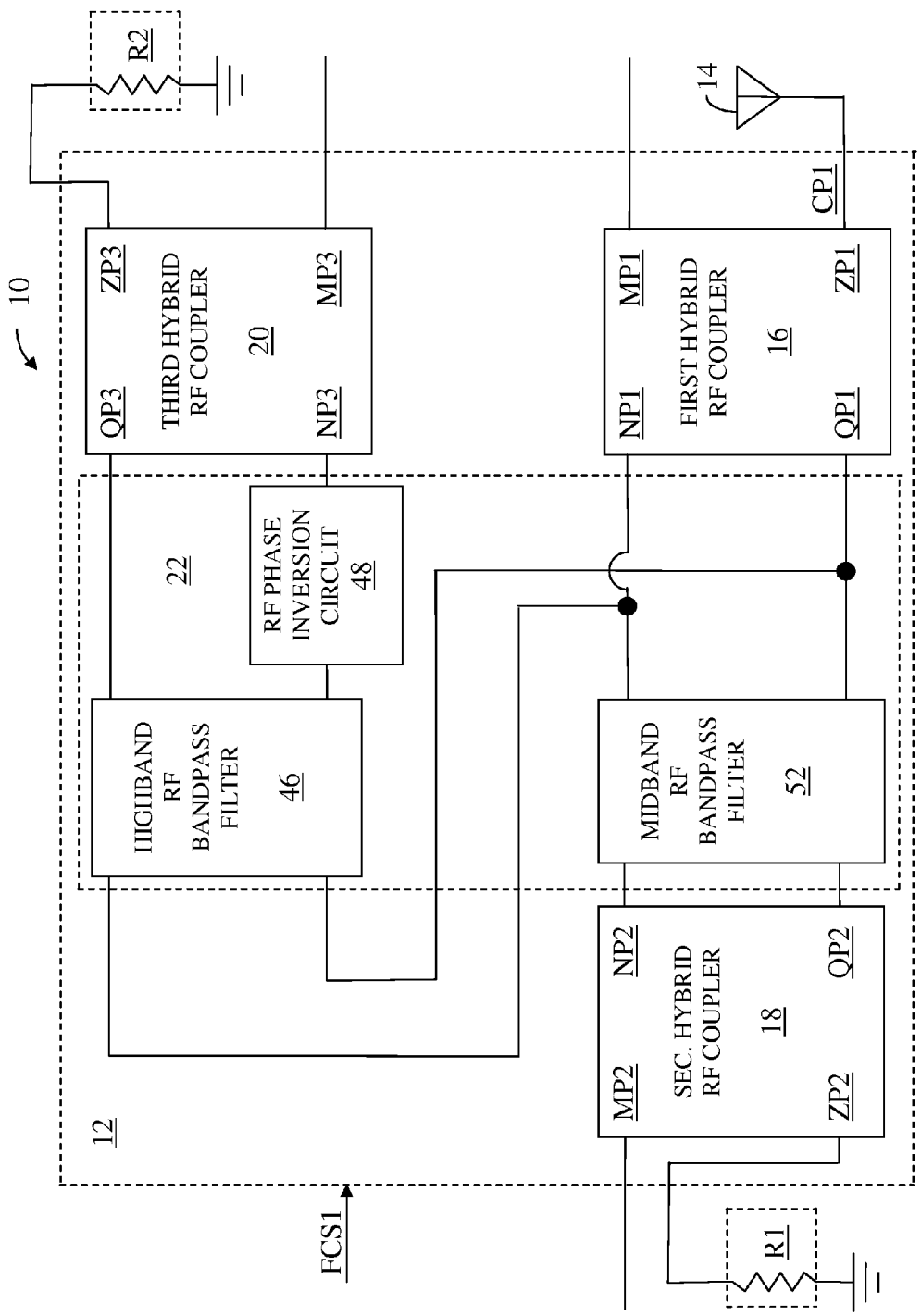
FIG. 17 shows details of the first RF triplexer illustrated in FIG. 15 according to one embodiment of the first RF triplexer.

FIG. 17 shows details of the first RF triplexer 12 illustrated in FIG. 15 according to one embodiment of the first RF triplexer 12. The first RF triplexer 12 illustrated in FIG. 17 is similar to the first RF triplexer 12 illustrated in FIG. 16, except in the first RF triplexer 12 illustrated in FIG. 17, the highband RF highpass filter 50 is replaced with the highband RF bandpass filter 46 and the midband RF lowpass filter 62 is replaced with the midband RF bandpass filter 52.

As such, the midband RF bandpass filter 52 is coupled between the second hybrid RF coupler 18 and the first hybrid RF coupler 16. In one embodiment of the midband RF bandpass filter 52, the midband RF bandpass filter 52 is a tunable RF bandpass filter, such that a frequency response of the midband RF bandpass filter 52 is tunable based on the first function configuration signal FCS1.

The RF phase inversion circuit 48 and the highband RF bandpass filter 46 are coupled in series between the third hybrid RF coupler 20 and the first hybrid RF coupler 16. In one embodiment of the highband RF bandpass filter 46, the highband RF bandpass filter 46 is a tunable RF bandpass filter, such that a frequency response of the highband RF bandpass filter 46 is tunable based on the first function configuration signal FCS1.

The first RF triplexer 12 illustrated in FIG. 17 may process the first ultra-highband RF transmit signal TXU1 and the first ultra-highband RF receive signal RXU1 similarly to the first midband RF transmit signal TXM1 and the first midband RF receive signal RXM1 illustrated in FIGS. 5 and 6, respectively.

The first RF triplexer 12 illustrated in FIG. 16 may process the first highband RF transmit signal TXH1 and the first highband RF receive signal RXH1 similarly to the first highband RF transmit signal TXH1 and the first highband RF receive signal RXH1 illustrated in FIG. 11. The first RF triplexer 12 illustrated in FIG. 16 may process the first midband RF transmit signal TXM1 and the first midband RF receive signal RXM1 similarly to the first lowband RF transmit signal TXL1 and the first lowband RF receive signal RXL1 illustrated in FIG. 10.

Figure 18:
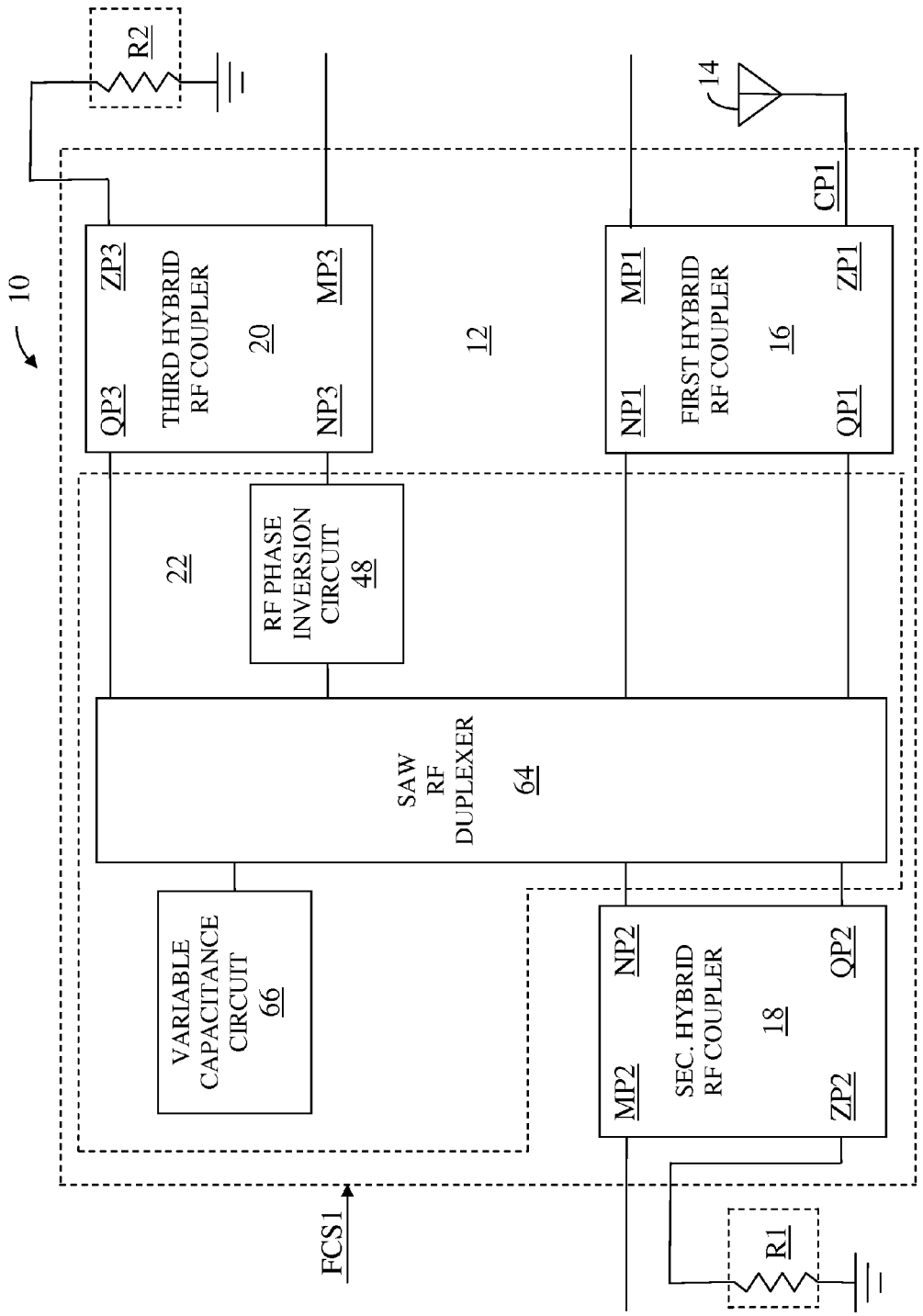
FIG. 18 shows details of the first RF triplexer illustrated in FIG. 15 according to one embodiment of the first RF triplexer.

FIG. 18 shows details of the first RF triplexer 12 illustrated in FIG. 15 according to one embodiment of the first RF triplexer 12. The first RF triplexer 12 illustrated in FIG. 18 is similar to the first RF triplexer 12 illustrated in FIG. 17, except in the first RF triplexer 12 illustrated in FIG. 18, the highband RF bandpass filter 46 and the midband RF bandpass filter 52 are replaced with a surface acoustic wave (SAW) RF duplexer 64 and a variable capacitance circuit 66.

As such, the SAW RF duplexer 64 is coupled between the first hybrid RF coupler 16 and the second hybrid RF coupler 18. Additionally, the RF phase inversion circuit 48 and the SAW RF duplexer 64 are coupled in series between the third hybrid RF coupler 20 and the first hybrid RF coupler 16. The variable capacitance circuit 66 is coupled to the SAW RF duplexer 64. As such, the variable capacitance circuit 66 presents at least one variable capacitance to the SAW RF duplexer 64 based on the first function configuration signal FCS1. In an alternate embodiment of the first RF triplexer 12, the variable capacitance circuit 66 is omitted.

In one embodiment of the SAW RF duplexer 64, the SAW RF duplexer 64 has at least one RF lowpass filter response, at least one RF highpass filter response, at least one RF bandpass filter response, the like, or any combination thereof. In one embodiment of the SAW RF duplexer 64, each RF lowpass filter response has a corresponding break frequency, which is tunable based on a corresponding variable capacitance provided by the variable capacitance circuit 66. In one embodiment of the SAW RF duplexer 64, each RF highpass filter response has a corresponding break frequency, which is tunable based on a corresponding variable capacitance provided by the variable capacitance circuit 66. In one embodiment of the SAW RF duplexer 64, each RF bandpass filter response has at least one corresponding notch frequency, which is tunable based on a corresponding variable capacitance provided by the variable capacitance circuit 66.

In a first embodiment of the SAW RF duplexer 64, a tuning range of a break frequency of an RF lowpass filter response is greater than about two percent of the break frequency and less than about three percent of the break frequency. In a second embodiment of the SAW RF duplexer 64, a tuning range of the break frequency of the RF lowpass filter response is greater than about one percent of the break frequency and less than about two percent of the break frequency. In a third embodiment of the SAW RF duplexer 64, a tuning range of the break frequency of the RF lowpass filter response is greater than about one-half percent of the break frequency and less than about one percent of the break frequency.

In a fourth embodiment of the SAW RF duplexer 64, a tuning range of a break frequency of an RF highpass filter response is greater than about two percent of the break frequency and less than about three percent of the break frequency. In a fifth embodiment of the SAW RF duplexer 64, a tuning range of the break frequency of the RF highpass filter response is greater than about one percent of the break frequency and less than about two percent of the break frequency. In a sixth embodiment of the SAW RF duplexer 64, a tuning range of the break frequency of the RF highpass filter response is greater than about one-half percent of the break frequency and less than about one percent of the break frequency.

In a seventh embodiment of the SAW RF duplexer 64, a tuning range of a notch frequency of an RF bandpass filter response is greater than about two percent of the notch frequency and less than about three percent of the notch frequency. In an eighth embodiment of the SAW RF duplexer 64, a tuning range of the notch frequency of the RF bandpass filter response is greater than about one percent of the notch frequency and less than about two percent of the notch frequency. In a ninth embodiment of the SAW RF duplexer 64, a tuning range of the notch frequency of the RF bandpass filter response is greater than about one-half percent of the notch frequency and less than about one percent of the notch frequency.

Figure 19:
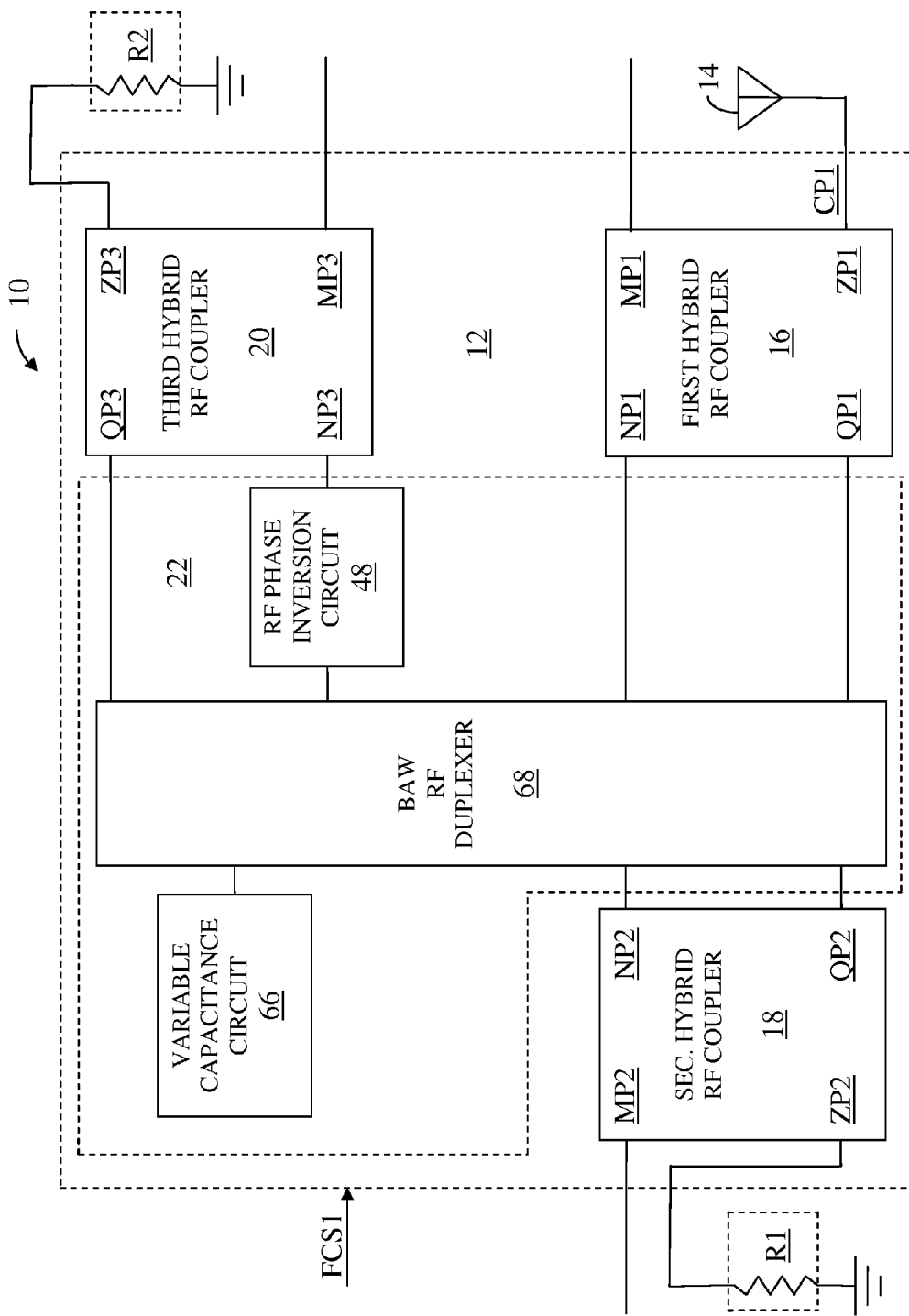
FIG. 19 shows details of the first RF triplexer illustrated in FIG. 15 according to one embodiment of the first RF triplexer.

FIG. 19 shows details of the first RF triplexer 12 illustrated in FIG. 15 according to one embodiment of the first RF triplexer 12. The first RF triplexer 12 illustrated in FIG. 19 is similar to the first RF triplexer 12 illustrated in FIG. 18, except in the first RF triplexer 12 illustrated in FIG. 19, the SAW RF duplexer 64 is replaced with a bulk acoustic wave (BAW) RF duplexer 68

As such, the BAW RF duplexer 68 is coupled between the first hybrid RF coupler 16 and the second hybrid RF coupler 18. Additionally, the RF phase inversion circuit 48 and the BAW RF duplexer 68 are coupled in series between the third hybrid RF coupler 20 and the first hybrid RF coupler 16. The variable capacitance circuit 66 is coupled to the BAW RF duplexer 68. As such, the variable capacitance circuit 66 presents at least one variable capacitance to the BAW RF duplexer 68 based on the first function configuration signal FCS1. IN an alternate embodiment of the first RF triplexer 12, the variable capacitance circuit 66 is omitted.

In one embodiment of the BAW RF duplexer 68, the BAW RF duplexer 68 has at least one RF lowpass filter response, at least one RF highpass filter response, at least one RF bandpass filter response, the like, or any combination thereof. In one embodiment of the BAW RF duplexer 68, each RF lowpass filter response has a corresponding break frequency, which is tunable based on a corresponding variable capacitance provided by the variable capacitance circuit 66. In one embodiment of the BAW RF duplexer 68, each RF highpass filter response has a corresponding break frequency, which is tunable based on a corresponding variable capacitance provided by the variable capacitance circuit 66. In one embodiment of the BAW RF duplexer 68, each RF bandpass filter response has at least one corresponding notch frequency, which is tunable based on a corresponding variable capacitance provided by the variable capacitance circuit 66.

In a first embodiment of the BAW RF duplexer 68, a tuning range of a break frequency of an RF lowpass filter response is greater than about two percent of the break frequency and less than about three percent of the break frequency. In a second embodiment of the BAW RF duplexer 68, a tuning range of the break frequency of the RF lowpass filter response is greater than about one percent of the break frequency and less than about two percent of the break frequency. In a third embodiment of the BAW RF duplexer 68, a tuning range of the break frequency of the RF lowpass filter response is greater than about one-half percent of the break frequency and less than about one percent of the break frequency.

In a fourth embodiment of the BAW RF duplexer 68, a tuning range of a break frequency of an RF highpass filter response is greater than about two percent of the break frequency and less than about three percent of the break frequency. In a fifth embodiment of the BAW RF duplexer 68, a tuning range of the break frequency of the RF highpass filter response is greater than about one percent of the break frequency and less than about two percent of the break frequency. In a sixth embodiment of the BAW RF duplexer 68, a tuning range of the break frequency of the RF highpass filter response is greater than about one-half percent of the break frequency and less than about one percent of the break frequency.

In a seventh embodiment of the BAW RF duplexer 68, a tuning range of a notch frequency of an RF bandpass filter response is greater than about two percent of the notch frequency and less than about three percent of the notch frequency. In an eighth embodiment of the BAW RF duplexer 68, a tuning range of the notch frequency of the RF bandpass filter response is greater than about one percent of the notch frequency and less than about two percent of the notch frequency. In a ninth embodiment of the BAW RF duplexer 68, a tuning range of the notch frequency of the RF bandpass filter response is greater than about one-half percent of the notch frequency and less than about one percent of the notch frequency.

Figure 20:
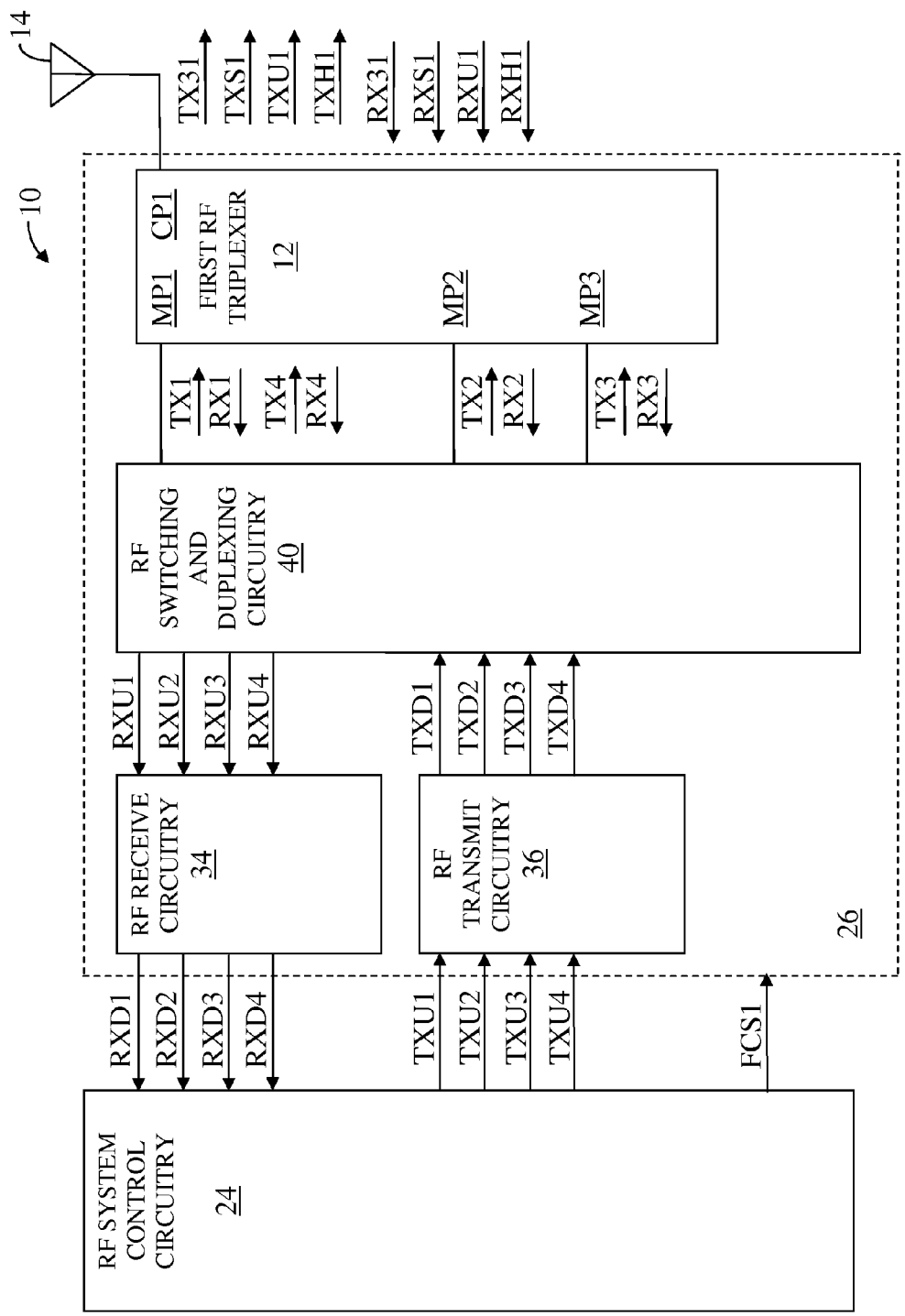
FIG. 20 shows the RF communications circuitry according to one embodiment of the RF communications circuitry.

FIG. 20 shows the RF communications circuitry 10 according to one embodiment of the RF communications circuitry 10. The RF communications circuitry 10 illustrated in FIG. 20 is similar to the RF communications circuitry 10 illustrated in FIG. 15, except in the RF communications circuitry 10 illustrated in FIG. 20, the first midband RF transmit signal TXM1 and the first midband RF receive signal RXM1 are replaced with a first Band 30 RF transmit signal TX31 and a first Band 30 RF receive signal RX31.

In one embodiment of the first Band 30 RF transmit signal TX31, a carrier frequency of the first Band 30 RF transmit signal TX31 is greater than about 2305 megahertz and less than about 2360 megahertz. In one embodiment of the first Band 30 RF receive signal RX31, a carrier frequency of the first Band 30 RF receive signal RX31 is greater than about 2305 megahertz and less than about 2360 megahertz.

Those skilled in the art will recognize improvements and modifications to the embodiments of the present disclosure. All such improvements and modifications are considered within the scope of the concepts disclosed herein and the claims that follow.

What is claimed is:

1. A Radio Frequency (RF) triplexer comprising:
a first hybrid RF coupler which provides a first main port, a first pair of quadrature ports, and an isolation port;
a second hybrid RF coupler which provides a second main port and a second pair of quadrature ports;
a third hybrid RF coupler which provides a third main port and a third pair of quadrature ports; and
RF filter circuitry coupled to the first pair of quadrature ports, the second pair of quadrature ports, and the third pair of quadrature ports; wherein the first main port, the second main port, and the third main port provide main ports of the RF triplexer; and the isolation port is a common port of the RF triplexer for coupling to an RF antenna, wherein the RF triplexer is configured to:
substantially pass at least a first RF signal between the common port and the first main port, such that a carrier frequency of the at least a first RF signal is between about 2400 megahertz and about 2490 megahertz;
substantially pass at least a second RF signal between the common port and the second main port, such that a carrier frequency of the at least a second RF signal is between about 1700 megahertz and about 2300 megahertz; and
substantially pass at least a third RF signal between the common port and the third main port, such that a carrier frequency of the at least a third RF signal is between about 2500 megahertz and about 2700 megahertz.

2. The RF triplexer of claim 1 wherein the RF filter circuitry comprises an RF lowpass filter, an RF highpass filter, and an RF phase inversion circuit; such that the RF lowpass filter is coupled between the second hybrid RF coupler and the first hybrid RF coupler, and the RF highpass filter and the RF phase inversion circuit are coupled in series between the third hybrid RF coupler and the first hybrid RF coupler.

3. The RF triplexer of claim 1 wherein the RF triplexer is further configured to substantially pass at least a fourth RF signal between the common port and the first main port, such that a carrier frequency of the at least a fourth RF signal is between about 3400 megahertz and about 3600 megahertz.

4. The RF triplexer of claim 3 wherein the RF filter circuitry comprises an RF phase inversion circuit and a (bulk acoustic wave) BAW RF duplexer; such that the RF phase inversion circuit and the BAW RF duplexer are coupled in series between the third hybrid RF coupler and the first hybrid RF coupler, and the BAW RF duplexer is coupled between the second hybrid RF coupler and the first hybrid RF coupler.

5. The RF triplexer of claim 3 wherein the RF filter circuitry comprises a first RF bandpass filter, a second RF bandpass filter, and an RF phase inversion circuit; such that the first RF bandpass filter is coupled between the second hybrid RF coupler and the first hybrid RF coupler, and the second RF bandpass filter and the RF phase inversion circuit are coupled in series between the third hybrid RF coupler and the first hybrid RF coupler.

6. The RF triplexer of claim 3 wherein the RF filter circuitry comprises an RF phase inversion circuit and a (surface acoustic wave) SAW RF duplexer; such that the RF phase inversion circuit and the SAW RF duplexer are coupled in series between the third hybrid RF coupler and the first hybrid RF coupler, and the SAW RF duplexer is coupled between the second hybrid RF coupler and the first hybrid RF coupler.

7. A Radio Frequency (RF) triplexer comprising:
 a first hybrid RF coupler which provides a first main port, a first pair of quadrature ports, and an isolation port;
 a second hybrid RF coupler which provides a second main port and a second pair of quadrature ports;
 a third hybrid RF coupler which provides a third main port and a third pair of quadrature ports; and
 RF filter circuitry coupled to the first pair of quadrature ports, the second pair of quadrature ports, and the third pair of quadrature ports; wherein the first main port, the second main port, and the third main port provide main ports of the RF triplexer; and the isolation port is a common port of the RF triplexer for coupling to an RF antenna, wherein the RF triplexer is configured to:
  substantially pass at least a first RF signal between the common port and the first main port, such that a carrier frequency of the at least a first RF signal is between about 2500 megahertz and about 2700 megahertz;
  substantially pass at least a second RF signal between the common port and the second main port, such that a carrier frequency of the at least a second RF signal is between about 1700 megahertz and about 2300 megahertz; and
  substantially pass at least a third RF signal between the common port and the third main port, such that a carrier frequency of the at least a third RF signal is between about 2400 megahertz and about 2490 megahertz.

8. The RF triplexer of claim 7 wherein the RF filter circuitry comprises an RF phase inversion circuit and a (bulk acoustic wave) BAW RF duplexer; such that the RF phase inversion circuit and the BAW RF duplexer are coupled in series between the third hybrid RF coupler and the first hybrid RF coupler, and the BAW RF duplexer is coupled between the second hybrid RF coupler and the first hybrid RF coupler.

9. The RF triplexer of claim 7 wherein the RF triplexer is further configured to substantially pass at least a fourth RF signal between the common port and the first main port, such that a carrier frequency of the at least a fourth RF signal is between about 3400 megahertz and about 3600 megahertz.

10. The RF triplexer of claim 7 wherein the RF filter circuitry comprises an RF phase inversion circuit and a (surface acoustic wave) SAW RF duplexer; such that the RF phase inversion circuit and the SAW RF duplexer are coupled in series between the third hybrid RF coupler and the first hybrid RF coupler, and the SAW RF duplexer is coupled between the second hybrid RF coupler and the first hybrid RF coupler.

11. A Radio Frequency (RF) triplexer comprising:
 a first hybrid RF coupler which provides a first main port, a first pair of quadrature ports, and an isolation port;
 a second hybrid RF coupler which provides a second main port and a second pair of quadrature ports;
 a third hybrid RF coupler which provides a third main port and a third pair of quadrature ports; and
 RF filter circuitry coupled to the first pair of quadrature ports, the second pair of quadrature ports, and the third pair of quadrature ports; wherein the first main port, the second main port, and the third main port provide main ports of the RF triplexer; and the isolation port is a common port of the RF triplexer for coupling to an RF antenna, wherein the RF triplexer is configured to:
  substantially pass at least a first RF signal between the common port and the first main port, such that a carrier frequency of the at least a first RF signal is between about 1700 megahertz and about 2300 megahertz;
  substantially pass at least a second RF signal between the common port and the second main port, such that a carrier frequency of the at least a second RF signal is between about 2400 megahertz and about 2490 megahertz; and
  substantially pass at least a third RF signal between the common port and the third main port, such that a carrier frequency of the at least a third RF signal is between about 2500 megahertz and about 2700 megahertz.

12. The RF triplexer of claim 11 wherein the RF filter circuitry comprises an RF phase inversion circuit and a (bulk acoustic wave) BAW RF duplexer; such that the RF phase inversion circuit and the BAW RF duplexer are coupled in series between the third hybrid RF coupler and the first hybrid RF coupler, and the BAW RF duplexer is coupled between the second hybrid RF coupler and the first hybrid RF coupler.

13. The RF triplexer of claim 11 wherein the RF triplexer is further configured to substantially pass at least a fourth RF signal between the common port and the first main port, such that a carrier frequency of the at least a fourth RF signal is between about 3400 megahertz and about 3600 megahertz.

14. The RF triplexer of claim 11 wherein the RF filter circuitry comprises an RF phase inversion circuit and a (surface acoustic wave) SAW RF duplexer; such that the RF phase inversion circuit and the SAW RF duplexer are coupled in series between the third hybrid RF coupler and the first hybrid RF coupler, and the SAW RF duplexer is coupled between the second hybrid RF coupler and the first hybrid RF coupler.

15. A Radio Frequency (RF) triplexer comprising:
 a first hybrid RF coupler which provides a first main port, a first pair of quadrature ports, and an isolation port;
 a second hybrid RF coupler which provides a second main port and a second pair of quadrature ports;
 a third hybrid RF coupler which provides a third main port and a third pair of quadrature ports; and
 RF filter circuitry coupled to the first pair of quadrature ports, the second pair of quadrature ports, and the third pair of quadrature ports; wherein the first main port, the second main port, and the third main port provide main ports of the RF triplexer; and the isolation port is a common port of the RF triplexer for coupling to an RF antenna, wherein the RF triplexer is configured to:
  substantially pass at least a first RF signal between the common port and the first main port, such that a carrier frequency of the at least a first RF signal is between about 3400 megahertz and about 3600 megahertz;
  substantially pass at least a second RF signal between the common port and the second main port, such that a carrier frequency of the at least a second RF signal is between about 1700 megahertz and about 2300 megahertz; and substantially pass at least a third RF signal between the common port and the third main port, such that a carrier frequency of each of the at least a third RF signal is between about 2500 megahertz and about 2700 megahertz.

16. The RF triplexer of claim 15 wherein the RF filter circuitry comprises an RF phase inversion circuit and a (bulk acoustic wave) BAW RF duplexer; such that the RF phase inversion circuit and the BAW RF duplexer are coupled in series between the third hybrid RF coupler and the first hybrid RF coupler, and the BAW RF duplexer is coupled between the second hybrid RF coupler and the first hybrid RF coupler.

17. The RF triplexer of claim 15 wherein the RF triplexer is further configured to substantially pass at least a fourth RF signal between the common port and the first main port, such that a carrier frequency of the at least a fourth RF signal is between about 2400 megahertz and about 2490 megahertz.

18. The RF triplexer of claim 15 wherein the RF filter circuitry comprises an RF phase inversion circuit and a (surface acoustic wave) SAW RF duplexer; such that the RF phase inversion circuit and the SAW RF duplexer are coupled in series between the third hybrid RF coupler and the first hybrid RF coupler, and the SAW RF duplexer is coupled between the second hybrid RF coupler and the first hybrid RF coupler.

19. A Radio Frequency (RF) triplexer comprising:
a first hybrid RF coupler which provides a first main port, a first pair of quadrature ports, and an isolation port;
a second hybrid RF coupler which provides a second main port and a second pair of quadrature ports;
a third hybrid RF coupler which provides a third main port and a third pair of quadrature ports; and
RF filter circuitry coupled to the first pair of quadrature ports, the second pair of quadrature ports, and the third pair of quadrature ports; wherein the first main port, the second main port, and the third main port provide main ports of the RF triplexer; and the isolation port is a common port of the RF triplexer for coupling to an RF antenna, wherein the RF triplexer is configured to:
substantially pass at least a first RF signal between the common port and the first main port, such that a carrier frequency of the at least a first RF signal is between about 1700 megahertz and about 2300 megahertz;
substantially pass at least a second RF signal between the common port and the second main port, such that a carrier frequency of the at least a second RF signal is between about 2305 megahertz and about 2360 megahertz; and
substantially pass at least a third RF signal between the common port and the third main port, such that a carrier frequency of the at least a third RF signal is between about 2500 megahertz and about 2700 megahertz.

20. The RF triplexer of claim 19 wherein the RF filter circuitry comprises an RF phase inversion circuit and a (bulk acoustic wave) BAW RF duplexer; such that the RF phase inversion circuit and the BAW RF duplexer are coupled in series between the third hybrid RF coupler and the first hybrid RF coupler, and the BAW RF duplexer is coupled between the second hybrid RF coupler and the first hybrid RF coupler.

21. The RF triplexer of claim 19 wherein the RF triplexer is further configured to substantially pass at least a fourth RF signal between the common port and the first main port, such that a carrier frequency of the at least a fourth RF signal is between about 3400 megahertz and about 3600 megahertz.

22. The RF triplexer of claim 19 wherein the RF filter circuitry comprises an RF phase inversion circuit and a (surface acoustic wave) SAW RF duplexer; such that the RF phase inversion circuit and the SAW RF duplexer are coupled in series between the third hybrid RF coupler and the first hybrid RF coupler, and the SAW RF duplexer is coupled between the second hybrid RF coupler and the first hybrid RF coupler.

* * * * *